US011169200B2

(12) United States Patent
Robertazzi et al.

(10) Patent No.: US 11,169,200 B2
(45) Date of Patent: *Nov. 9, 2021

(54) METHOD FOR THE CHARACTERIZATION AND MONITORING OF INTEGRATED CIRCUITS

(71) Applicant: INTERNATIONAL BUSINESS MACHINES CORPORATION, Armonk, NY (US)

(72) Inventors: Raphael P. Robertazzi, Ossining, NY (US); Peilin Song, Lagrangeville, NY (US); Franco Stellari, Waldwick, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 188 days.

This patent is subject to a terminal disclaimer.

(21) Appl. No.: 16/529,398

(22) Filed: Aug. 1, 2019

(65) Prior Publication Data
US 2019/0353695 A1 Nov. 21, 2019

Related U.S. Application Data

(63) Continuation of application No. 15/354,095, filed on Nov. 17, 2016, now Pat. No. 10,429,433, which is a
(Continued)

(51) Int. Cl.
G01R 31/26 (2020.01)
G01R 31/30 (2006.01)
(Continued)

(52) U.S. Cl.
CPC ..... *G01R 31/2642* (2013.01); *G01R 31/2607* (2013.01); *G01R 31/2621* (2013.01);
(Continued)

(58) Field of Classification Search
CPC  G01R 31/275; G01R 31/311; G01R 31/2607; G01R 31/2621; G01R 31/2642;
(Continued)

(56) References Cited

U.S. PATENT DOCUMENTS 5,949,798 A    9/1999  Sakaguchi
6,043,662 A    3/2000  Alers et al.
(Continued)

OTHER PUBLICATIONS

List of IBM Patents or Patent Applications Treated as Related dated Aug. 1, 2019, 2 pages.
(Continued)

*Primary Examiner* — Minh N Tang
(74) *Attorney, Agent, or Firm* — Tutunjian & Bitetto. P.C.; Jeffrey S. LaBaw

(57) ABSTRACT

A method for characterizing an integrated circuit that includes ramping the supply voltage to an integrated circuit as a function of time for each of the transistors in the integrated circuit, and measuring a power supply current for the integrated circuit during the ramping of the power supply voltage. The measured peaks in the power supply current are a current pulse that identifies an operation state in which each of the transistors are in an on state. The peaks in the power supply current are compared to the reference peaks for the power supply current for a reference circuit having a same functionality as the integrated circuit to determine the integrated circuit's fitness.

20 Claims, 12 Drawing Sheets

Related U.S. Application Data continuation of application No. 14/194,156, filed on Feb. 28, 2014, now Pat. No. 9,568,540.

(51) Int. Cl.
  *G01R 31/27* (2006.01)
  *G01R 31/28* (2006.01)
  *G01R 31/311* (2006.01)

(52) U.S. Cl.
  CPC ....... *G01R 31/275* (2013.01); *G01R 31/2855* (2013.01); *G01R 31/3004* (2013.01); *G01R 31/311* (2013.01)

(58) Field of Classification Search
  CPC ............ G01R 31/2855; G01R 31/3004; G11C 11/5621; G11C 11/5642
  See application file for complete search history.

(56) References Cited

U.S. PATENT DOCUMENTS

| | | | |
|---|---|---|---|
| 6,714,032 B1 | 3/2004 | Reynick | |
| 6,717,428 B1 | 4/2004 | Spica | |
| 6,801,049 B2 | 10/2004 | Ishida et al. | |
| 6,873,171 B2 | 3/2005 | Reynick | |
| 6,992,497 B2 | 1/2006 | Furukawa et al. | |
| RE40,188 E | 3/2008 | Lofstrom | |
| 7,378,859 B2 | 5/2008 | Stellari et al. | |
| 7,482,657 B1 | 1/2009 | Lucero | |
| 7,539,589 B2 * | 5/2009 | Pineda De Gyvez | G01R 31/3008 702/117 |
| 7,564,226 B2 | 7/2009 | von Kaenel | |
| 7,613,580 B2 | 11/2009 | Gross et al. | |
| 7,812,595 B2 | 10/2010 | Okayasu et al. | |
| 8,214,169 B2 | 7/2012 | Bhavnagarwala et al. | |
| 8,341,759 B2 | 12/2012 | Gross | |
| 8,432,250 B2 | 4/2013 | Chmelar | |
| 9,075,106 B2 | 7/2015 | Bernstein et al. | |
| 10,379,152 B2 * | 8/2019 | Robertazzi | G01R 31/2621 |
| 10,429,433 B2 * | 10/2019 | Robertazzi | G01R 31/3004 |
| 2010/0001743 A1 | 1/2010 | Hemmady et al. | |

OTHER PUBLICATIONS

U.S. Office Action issued in related U.S. Appl. No. 15/093,190, dated Jan. 25, 2018, pp. 1-23.
Notice of Allowance dated Mar. 8, 2021 for U.S. Appl. No. 16/422,411, 23 pages.

* cited by examiner

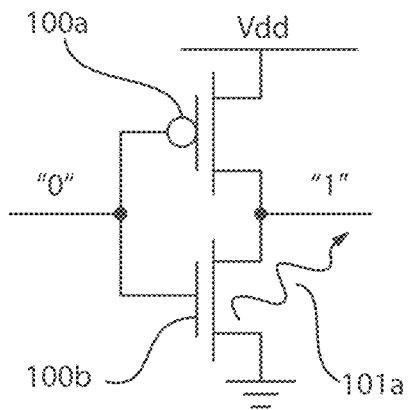 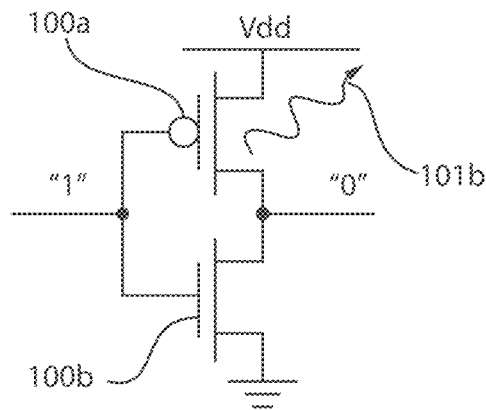
FIG. 8a  FIG. 8b
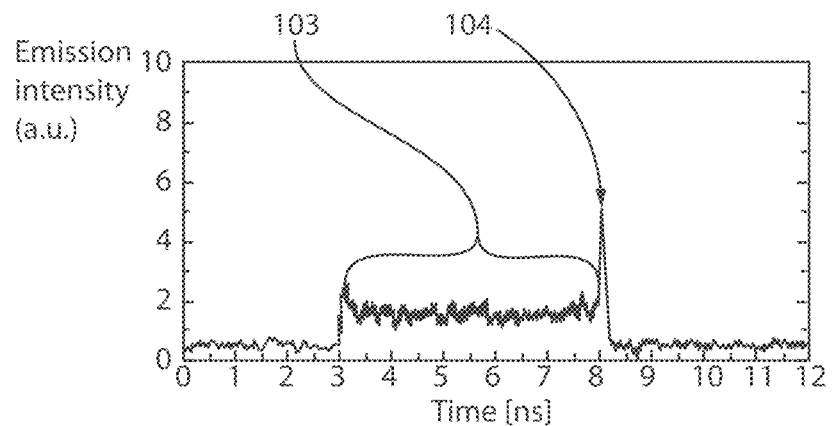
FIG. 9a
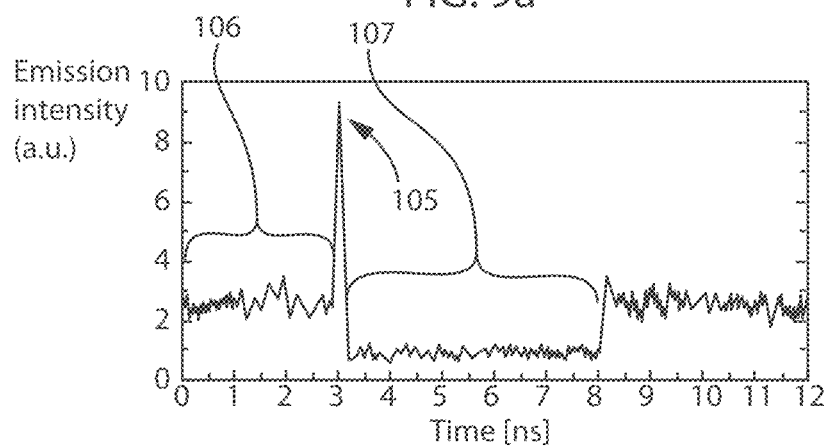
FIG. 9b

METHOD FOR THE CHARACTERIZATION AND MONITORING OF INTEGRATED CIRCUITS

This invention was made with Government support under Contract No.: HR0011-11-C-0060 (Defense Advanced Research Projects Agency (DARPA). The Government has certain rights in this invention.

BACKGROUND

Technical Field

The present disclosure relates to methods and systems for monitoring integrated circuits.

Description of the Related Art

The world economy is heavily dependent on an electronic infrastructure. Almost every aspect of day-to-day life can be controlled in one way or another by an electronic system. As our dependence on electronic systems has continued to grow, the reliability of these systems has become of paramount importance. Reliability is particularly important for electronics embedded in weapons, defense systems, and medical devices. Recent effort has been expanded on building diagnostics into chips in order to monitor aging effects throughout their use.

One threat to the reliability of electronic systems is the contamination of the electronic components supply chain by counterfeit integrated circuits (ICs). For example, some counterfeiters simply remove and refurbish the packages of used ICs from old discarded electronics. These used chips may be close to the end of their useful lives. In addition, the stripping and refurbishing process is often done in uncontrolled environments by workers unskilled in proper ESD (Electrostatic Discharge) handling techniques. As a consequence, the chips often undergo additional wear and damage when put through the refurbishment process.

SUMMARY

In one embodiment, a method of characterizing an integrated circuit is provided that includes ramping the power supply voltage of an integrated circuit (IC) as a function of time from below a threshold voltage for each of the transistors in the integrated circuit to above the threshold voltage for each of the transistors in the integrated circuit. A power supply current is measured for the integrated circuit while the power supply voltage is adjusted as a function of time. The peaks measured in the power supply current are current pulses. Each current pulse identifies an operation state of the integrated circuit, in which each of the transistors transition from being unbiased into an "ON" or "OFF" state. The peaks in the power supply current are then compared to reference peaks for a reference circuit having a same functionality as the integrated circuit to determine integrated circuit fitness.

In another aspect, a non-transitory computer readable storage medium is provided that includes a computer readable program for characterizing an integrated circuit. The non-transitory computer readable program when executed on a computer causes the computer to perform steps that include ramping the power supply voltage to an integrated circuit as a function of time from below a threshold voltage for each of the transistors in the integrated circuit to above the threshold voltage for each of the transistors in the integrated circuit. The power supply current is measured for the integrated circuit while the power supply voltage is ramped from below a threshold voltage for each of the transistors in the integrated circuit to above the threshold voltage for each of the transistors in the integrated circuit. Each of the measured peaks in the power supply current is a current pulse that identifies an operation state in which each of the transistors transition from being unbiased into an "ON" or "OFF" state. In a following step, the peaks in the power supply current are then compared to reference peaks for a reference circuit having a same functionality as the integrated circuit to determine integrated circuit fitness.

In another aspect, a system for characterizing an integrated circuit is provided that includes a device power supply in electrical communication to at least one pin of the integrated circuit for providing a power supply voltage to the integrated circuit, and a waveform generator configured to control a ramp rate of the power supply voltage from the device power supply to the integrated circuit. A signal recorder is configured to measure current through the integrated circuit simultaneously with the power supply voltage being ramped through the integrated circuit.

In yet another aspect of the present disclosure, a method for characterizing an integrated circuit is provided that includes selecting at least two devices from an integrated circuit for measuring light emission, wherein each of the at least two devices have a different level of stress. Power may then be applied to the integrated circuit. Following the application of power to the integrated circuit, light emission may be measured from the at least two devices. The light emission that is measured from the at least two devices may then be compared to one another. A difference in the light emission that is measured from the two devices that is greater than a predetermined ratio indicates that at least one of the devices from the at least two devices has a below specification performance. In some embodiments, the presence of a device having a below specification performance may indicate a counterfeit device.

BRIEF DESCRIPTION OF DRAWINGS

The disclosure will provide details in the following description of preferred embodiments with reference to the following figures wherein:

FIGS. 8a and 8b are circuit diagrams of inverters indicating light emission types in p-type and n-type field effect transistors in response to whether the input into the inverter is "0" or "1", in accordance with some embodiments of the present disclosure.

FIG. 9a is a plot illustrating emission intensity from the n-type field effect transistors of the inverter depicted in FIGS. 8a and 8b as a function of time as the input to the inverter is switched from "1" to "0", in accordance with some embodiments of the present disclosure.

FIG. 9b is a plot illustrating emission intensity from the p-type field effect transistors of the inverter depicted in FIGS. 8a and 8b as a function of time as the input to the inverter is switched from "1" to "0", in accordance with some embodiments of the present disclosure.

FIG. 10b is a magnified view of a portion of the emission map depicted in FIG. 10a.

DETAILED DESCRIPTION OF PREFERRED EMBODIMENTS

Figure 1:
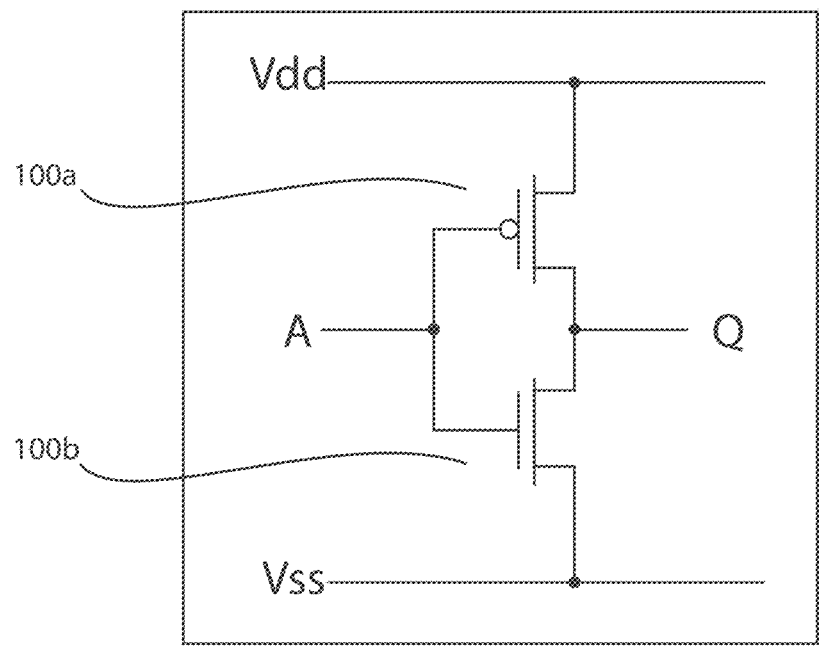
FIG. 1 is a circuit diagram of an inverter in a complementary metal oxide semiconductor (CMOS) arrangement, in accordance with one embodiment of the present disclosure.

Detailed embodiments of the claimed methods, systems and computer program product are disclosed herein; however, it is to be understood that the disclosed embodiments are merely illustrative of the claimed methods, systems and computer program products that may be embodied in various forms. In addition, each of the examples given in connection with the various embodiments are intended to be illustrative, and not restrictive. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

In some embodiments, the present disclosure provides an efficient test method that can probe the internal parametrics of transistors within an integrated circuit and develop an electronic "finger print" of the device. The methods, systems and computer products disclosed herein may have applications including, but not limited to, counterfeit chip detection, monitoring chip aging, as well as in the evaluation of a stored stock pile of integrated circuits. The method typically requires only current measurements on the power supply pins for the integrated circuit, and is generally applicable to any integrated circuit. Further, the method is simple to implement, because it does not require functional test of the part under inspection. As a parametric test, it is sensitive to the detailed device characteristics of the transistors within the part and will be sensitive to device threshold voltage (Vt) shifts over time and devices fabricated by different manufactures, which have different threshold voltage (Vt) distributions.

As will be appreciated by one skilled in the art, some aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As indicated above, the present disclosure provides an efficient test method that in one embodiment can probe the internal parametrics of transistors within an integrated circuit. Typically, common integrated circuits include field effect transistors (FETs) as the basic active device for both digital and mixed signal circuits, e.g., integrated circuits. A "field effect transistor (FET)" is a semiconductor device in which the output current, i.e., source-drain current, is controlled by the voltage applied to the gate. A FET has three terminals, i.e., gate structure, source region and drain region. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain. The term "gate structure" means a structure used to control output current (i.e., flow of carriers in the channel) of a semiconducting device through electrical or magnetic fields. The FET is characterized by the so called threshold voltage "Vt". The "threshold voltage" is the potential applied to the gate structure that is required to initiate a conducting channel in the device. Complex parts often contain FETs with a number of different threshold voltages, depending on the requirements of the individual circuit elements that make up the design. Although, the methods, systems and computer program products of the present disclosure are described herein with reference to field effect transistors, the present disclosure is not limited to only complementary metal oxide semiconductor (CMOS) technology, but might have applications for electronics based on other technologies as well, such as those based on bipolar junction transistors (BJT) or junction field effect transistors (JFET).

In some embodiments, the present disclosure provides methods, systems and computer program products that can measure the threshold voltage (Vt) distributions for all of the different transistors in a part, i.e., integrated circuit, in which this information can be used to monitor both the point of origin of the device, and the power on hours of the device. It has been determined that integrated circuits with identical functionality manufactured by two different suppliers will not have identical threshold voltage distributions, because of process implementation differences between different fabrication facilities. In view of this principle, functionally equivalent parts, e.g., integrated circuits, can be uniquely identified by manufacturer by comparing the threshold voltage (Vt) distribution of a part in question against a known reference library of threshold voltage (Vt) distributions for the part. This information can be used to identify counterfeit integrated circuits, which may bear fraudulent markings.

The above described tests that determine the threshold voltage distribution of a part, e.g., integrated circuit, can also be used to monitor the number of power on hours for an integrated circuit. A number of effects can influence the reliability and mean time to failure for an integrated circuit. Broadly speaking, the phenomena that influence the reliability and mean time to failure for integrated circuits can be broken down into degradation processes that effect the active devices (transistors), and degradation processes that effect the passive components of the device, e.g., interconnect components, such as wires, insulators, and vias. For integrated circuits that are based predominantly on field effect transistors (FETs), one of the greatest reliability concerns is transistor degradation caused by the negative bias instability (NBTI). In this effect, negative bias of the gate structure with respect to the source region and elevated temperature, e.g., temperatures ranging from 60° C. to 125° C., can cause a shift in the transistor threshold voltage (Vt) and saturation drain current (IDsat), predominantly of the p-type devices, such as p-type FETs, during normal product lifetimes (<10 years). For digital circuits, threshold voltage shifts can affect the timing of critical paths within the integrated circuit, leading to circuit performance degradation or complete failure. For analog circuits, threshold voltage (Vt) shifts can be even more of a problem, due to the fact that many circuits rely on tight matching of the threshold voltage (Vt) between transistor pairs. In some embodiments, by measuring the threshold voltage (Vt) distributions within the circuit, and comparing the measured threshold voltage (Vt) distribution to the data for a virgin part, i.e., integrated circuit that has not been subjected to service, e.g., subjected to an electrical bias, the methods, systems and computer program products disclosed herein can monitor the health of the integrated circuit and gauge the number of hours it has been under bias.

In some embodiments, the methods, systems and computer program products that are disclosed herein measure the threshold voltage (Vt) distribution within an integrated circuit based on measuring the power supply current (Idd) as the integrated circuit is brought to an operating bias condition. As used herein, the term "operating bias condition" means the point of the design when all of the field effect transistors, e.g., n-type and p-type field effect transistors, in the device, i.e., integrated circuit, have achieved their nominal operating bias points, i.e., nodes which require connection to bias are biased at the designed operating points. These transistors may be "OFF" state or "ON" state depending on the gate bias. In an unbiased state, current is not being directed to the semiconductor devices. In an "ON" state, current is being directed to the semiconductor devices, in which the channel region is biased to provide current from the source region to drain regions of the device. In an "OFF" state, current is being directed to the semiconductor device, in which the channel is biased so that current does not extend from the source regions to the drain regions of the device.

FIG. 1 outlines the basic building block of a complementary metal oxide semiconductor integrated circuit, i.e., the inverter gate. The inverter circuit is typical of many elements found in complementary metal oxide semiconductor designs. Input A is connected to the gates of the inverter stage, composed of a complementary transistor pair, i.e., an n-type field effect transistor (NFET) 100b and a p-type field effect transistor (PFET) 100a. The gate for each of the PFET 100a and NFET 100b is electrically isolated from the channel. It draws only the gate leakage tunneling current. Similarly, when the inverter is in one of its two stationary states, the output stage draws very little current, because one transistor of the pair is off, and the output Q is connected to the high impedance input stage of another cell (typically connected to another gate of a field effect transistor). In this way the inverter cell draws very little current under static conditions.

When the inverter gate changes state (and this is generally true for a CMOS digital circuit), current will flow for a brief period of time only as the state of the PFET 100a and NFET 100b change. During the transition, as one transistor is biased into its on state and the other turns off, there will be a period of time when the gate biases of both devices will be close to the threshold voltage (Vt), at which the transistor channel begins to conduct. During this metastable state of the gate, current will flow through the channels of both transistors, i.e., the PFET 100a and the NFET 100b. The sequence of events in which the devices in this gate move from zero bias, through the metastable state which draws significant supply current, and then finally achieves the design point bias specification (where the supply current drops substantially) is one example of what may be referred to as achieving the "operating bias condition" for the integrated circuit.

Figure 2:
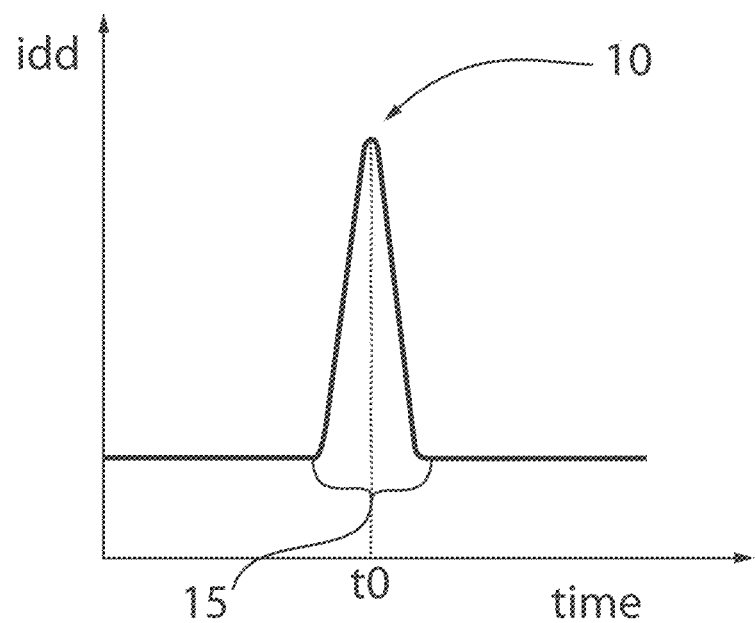
FIG. 2 is a plot of the device current as a function of time for an integrated circuit (IC), wherein the peak of the supply current (Idd) vs. time plot illustrates a switching event in the integrated circuit, in accordance with one embodiment of the present disclosure.

FIG. 2 depicts the current drawn by a circuit consistent with FIG. 1 as a function of time. At time t0, there is a switching event 10, which is commensurate with a pulse of power supply current 15. At time t0, the device undergoes a change in logic state, causing an increase in power supply current during the switching event. At the other time periods depicted in FIG. 2, the device state is stationary. It has been determined that the power supply voltage (Vdd) at which the pulse supply current 15 occurs is approximate to the threshold voltage (Vt) for the devices. Therefore, in some embodiments, by measuring the pulse supply current 15, the distribution of the threshold voltage (Vt) for the number of transistors within an integrated circuit can be determined.

Figure 3:
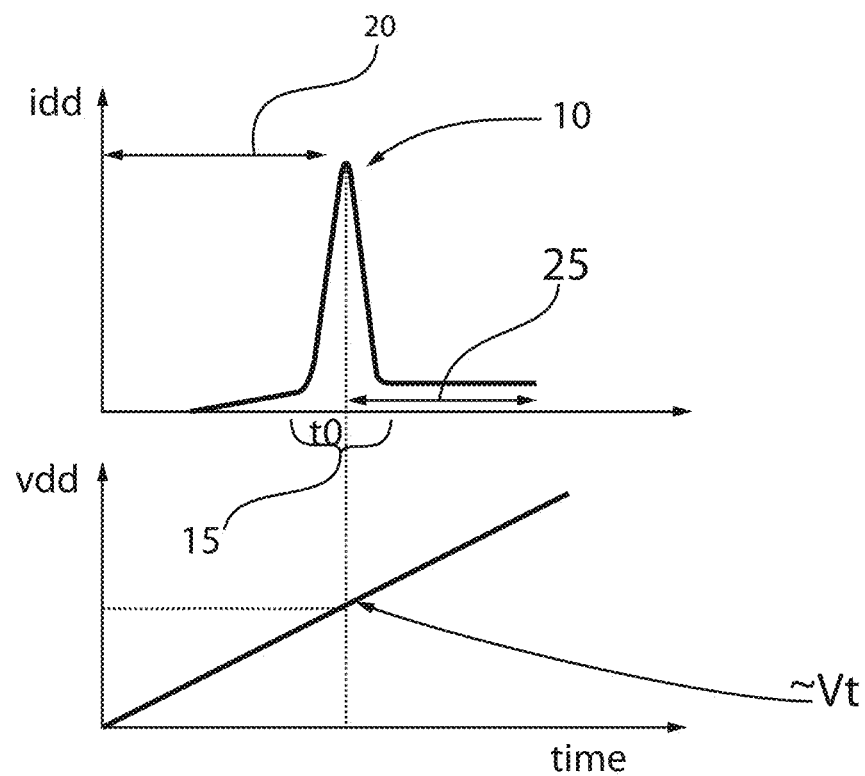
FIG. 3 is a plot depicting power supply current (Idd) vs. power supply voltage (Vdd) for a complementary metal oxide semiconductor (CMOS) circuit, which is brought from a zero bias condition to its stable operating point at full supply voltage, in accordance with one embodiment of the present disclosure.

FIG. 3 illustrates one embodiment of how the CMOS circuit power supply current (Idd) behaves as it is brought from an unbiased condition to its operating point, i.e., operating bias condition or switching event 10. The upper plot indicates the power supply current (Idd) of the integrated circuit as a function of time, while the lower plot illustrates the corresponding power supply voltage (Vdd) of the integrated circuit as a function of time. In some embodiments, the power supply voltage (Vdd) is defined as the voltage level required to be applied to the power bus of the integrated circuit in order to operate the device. Here it is understood that power supply voltage (Vdd) refers to any supply voltage bias that the part may require, for integrated circuits that require multiple power supplies applied to different power domains in order to function. As used herein, the power supply current (Idd) is defined as the power supply current drawn by the integrated circuit. Here it is understood that the power supply current (Idd) refers to any supply current on any of the multiple power domains of the part which are required to be biased in order for the part to function. The voltage width of the transition region, i.e., corresponding to the width of the peak for the pulse supply current 15, will be related to the width of the threshold voltage (Vt) distribution, e.g., threshold voltage (Vt) distribution of all the NFET and PFET transistors in the device, as well as to the details of the circuit design. Similar to FIG. 2, at t0, there is a switching event 10, which is commensurate with a pulse of power supply current 15. Further, as the power supply voltage (Vdd) is raised from 0 volts, the transistors, e.g., NFET and PFET transistors, in the integrated circuit move from metastable states into one of their operating configurations as the power supply voltage (Vdd) becomes larger than the threshold voltage (Vt) for the devices. The threshold voltage (Vt) is identified on the plot of power supply voltage (Vdd) by ~Vt in FIG. 3. Prior to the power supply voltage (Vdd) reaching the threshold voltage (Vt), the integrated circuit is operating in a metastable region 20, wherein once supply voltage (Vdd) exceeds the threshold voltage (Vt) the integrated circuit is operating in a stable region 25.

Moving from the metastable to stable bias configuration, i.e., moving from the metastable region 20 to the stable region 25, is similar to device switching under normal bias. For example, moving out of the metastable region 20 is accompanied by device switching, i.e., the transistors move from being cut off (low bias) to having both P channel devices and N channel devices briefly conducting (in the metastable region) to the final stable bias configuration, where one transistor is "ON" and the other transistor is "OFF". In this configuration very little current will flow through the gate. The fact that both N channel devices and the P channel devices are briefly "ON" in the metastable region means that the circuit will experience a brief increase in power supply current as the stable region 20 is entered.

Referring to FIG. 3, the power on burst noise (POBN) spectrum is a plot of the power supply current that is taken while the power supply voltage (Vdd) is ramped. The transition to stable bias as power supply voltage (Vdd) increases typically accompanies an increase in the power supply current (Idd), which may be transitory, being present only briefly as the metastable to stable transition is made. The power supply voltage (Vdd) at which the surge in the power supply current (Idd) surge is observed will be related to, but not necessarily equal to, the transistor threshold voltage (Vt). The higher the threshold voltage (Vt), the higher the power supply voltage (Vdd) at which the current burst, i.e., spike in the power supply current (Idd), is observed. The exact value of the power supply voltage (Vdd) at which the current spike will be observed typically depends on the details of the circuit under test. The voltage width of the transition region will be related to the width of the (Vt) distribution in the device.

The threshold voltage (Vt) shift due to use (power on hours) in the design under test (DUT) can be quantified by measuring the voltage positions of the power on burst noise (POBN) peaks for a part with unknown history, and comparing this spectrum with one acquired from a virgin sample. This particular test would be applicable to counterfeit chip detection, in which the device under consideration was one with an unknown number of power on hours. In addition, the health of critical components within a system might be monitored by periodically measuring their power on burst noise (POBN) spectrum.

Figure 4:
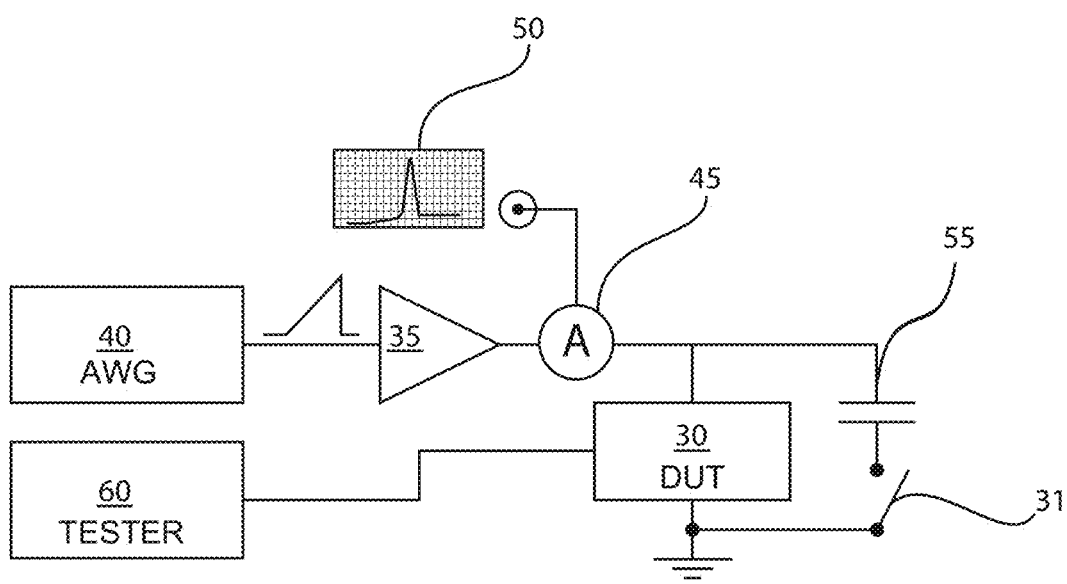
FIG. 4 is a schematic view depicting one embodiment of a power on burst noise (POBN) test system, in accordance with the present disclosure.

FIG. 4 depicts one possible implementation of a power on burst noise (POBN) test system. The power supply pins of the design under test (DUT) 30 are connected to a power amplifier 35, which in turn is driven by an arbitrary waveform generator (AWG) 40. The arbitrary waveform generator (AWG) 40 may apply a DC potential to set a DC power bias, or may be ramped to generate the POBN spectrum. A high speed ammeter 45 that is in series with the power connections allows the spectrum of the supply current (Idd) to be recorded by a transient digitizer 50, which is synchronized to the waveform generator 40. The transient digitizer 50 records individual burst noise spectra of supply current (Idd) as the voltage ramp is repeated from 0 volts to greater than the threshold voltage. The transient digitizer is a signal recorder capable of recording the time variation of the power supply current during the applied voltage ramp. For example, the voltage ramps may be repeated from several to thousands of times, or more. In one example, the voltage ramp is repeated 100 times. This allows acquisition of the average power on burst noise (POBN) of the design under test (DUT), as well as the statistics of the power supply current (Idd) at each voltage for each trial.

Still referring to FIG. 4, in some embodiments, the power on burst noise (POBN) test system includes connections to a conventional tester 50, as well as a bypass capacitor 55 connected to the pins of the power supply and a switch 31 that allows the capacitor 55 to be connected or disconnected as desired. Examples of conventional testers 50 that are suitable for use with the present disclosure include system on a chip testers (SOC) such as the V93K, manufactured by Advantest, and the microFlex manufactured by Teradyne. One use for the conventional tester would be to bias other supply pins on the chip during the power on burst noise (POBN) test of one power supply domain. Another use would be during product initial test. Standard functional test would be followed by acquisition of one or more power on burst noise (POBN) spectra on the design under test voltage domains.

The spectra acquired represent an "electronic finger print" of the part at the beginning of its operational life. The spectrum could then be recorded in a non-volatile memory portion of the integrated circuit, such as read only memory (ROM), to be used as a reference spectrum for later evaluation. This information could be used to monitor the characteristics of the active devices within the chip as it ages, and help determine when the part has reached the end of its useful life.

FIG. 4 also shows an optional bypass capacitor 55 and switch 31 that in some embodiments can be used to bypass the chip power domains during functional testing. In some instances, the functional test systems bypass of the power supply pins is required in order to reduce power supply voltage noise. In some embodiments, permanent installation of a bypass capacitor 55, can reduce the resolution of a power on burst noise (POBN) test, because its presence would contribute an additional leakage term during voltage ramp. This background leakage term can reduce the signal to noise of the power on burst noise (POBN) spectrum. For at least this reason, a bypass capacitor switch 31 can be advantageous.

One embodiment of a method for characterizing an integrated circuit is now described with reference to FIG. 5. The method described with reference to FIG. 5 may be referred to as a power on burst noise (POBN) test. The method may begin at step 65 of the process flow depicted in FIG. 5 with connecting the power on burst noise (POBN) test system to the pins of an integrated circuit. The power on burst noise (POBN) test system has been described above with reference to FIG. 4. One embodiment of the connection of the power on burst noise (POBN) test system to the pins of an integrated circuit is depicted in FIG. 6. FIG. 6 depicts a power on burst noise power supply 100c including a power amplifier 35, arbitrary waveform generator (AWG) 40 and high speed ammeter 45 connected to the power pins 32 of the design under test (DUT) 30 through a switch 33. The pins 32 of the integrated circuit, e.g., DUT 30, are the contact points to the wiring to the transistors, e.g., NFET and PFETs, which are present within the integrated circuit. In some embodiments, the switch 33 provides that the DUT 30 can be disconnected from a power supply 31 when the burst noise power supply 100c is in communication with the DUT 30. Grounding pins 34 may also be present in the DUT 30. FIG. 6 represents only one embodiment of connection of the power on burst noise (POBN) test system to the pins of an integrated circuit, and is not intended to limit the present disclosure.

Figure 5:
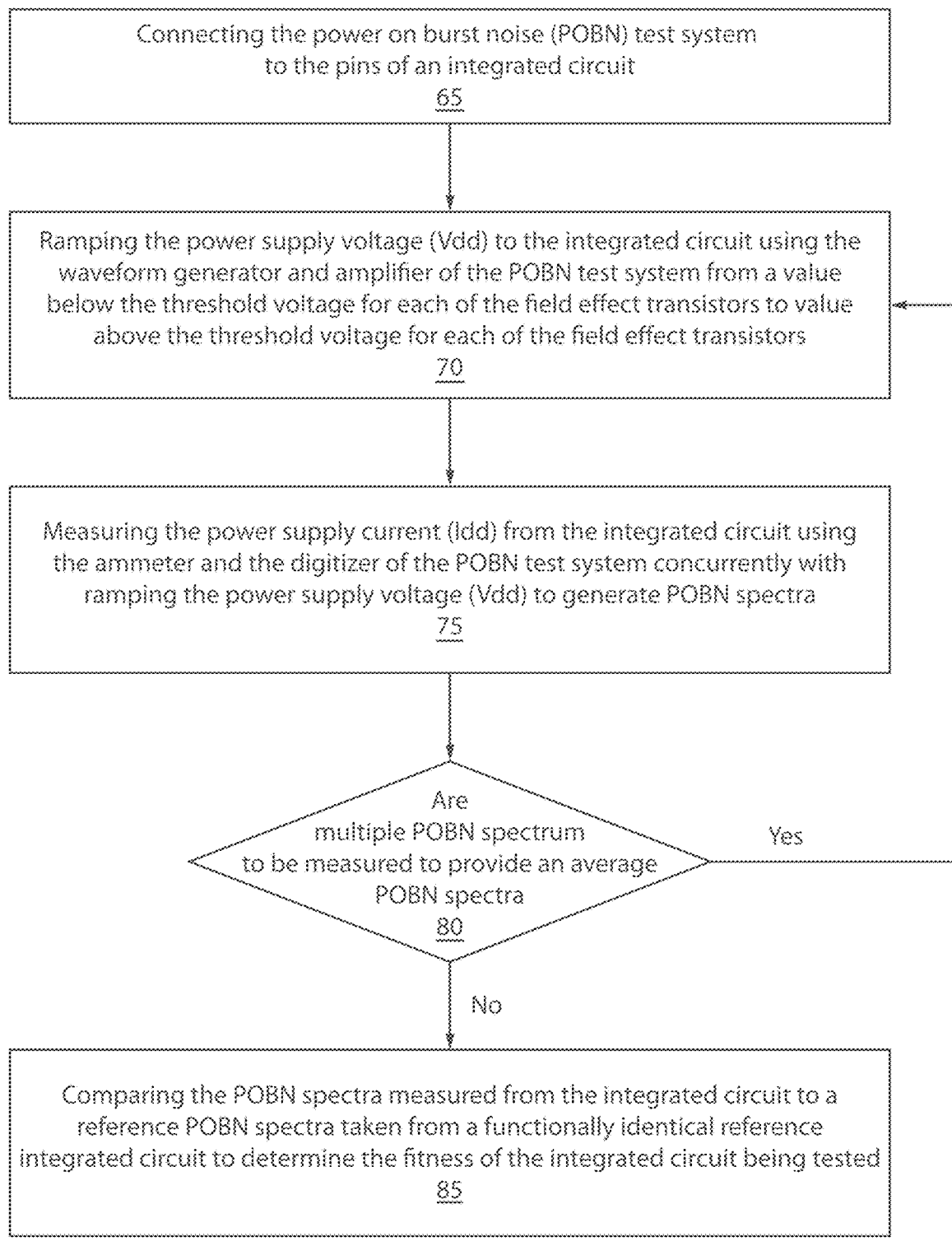
FIG. 5 is a flow diagram for one embodiment of a method of characterizing an integrated circuit using a power on burst noise (POBN) test system, in accordance with the present disclosure.
Figure 6:
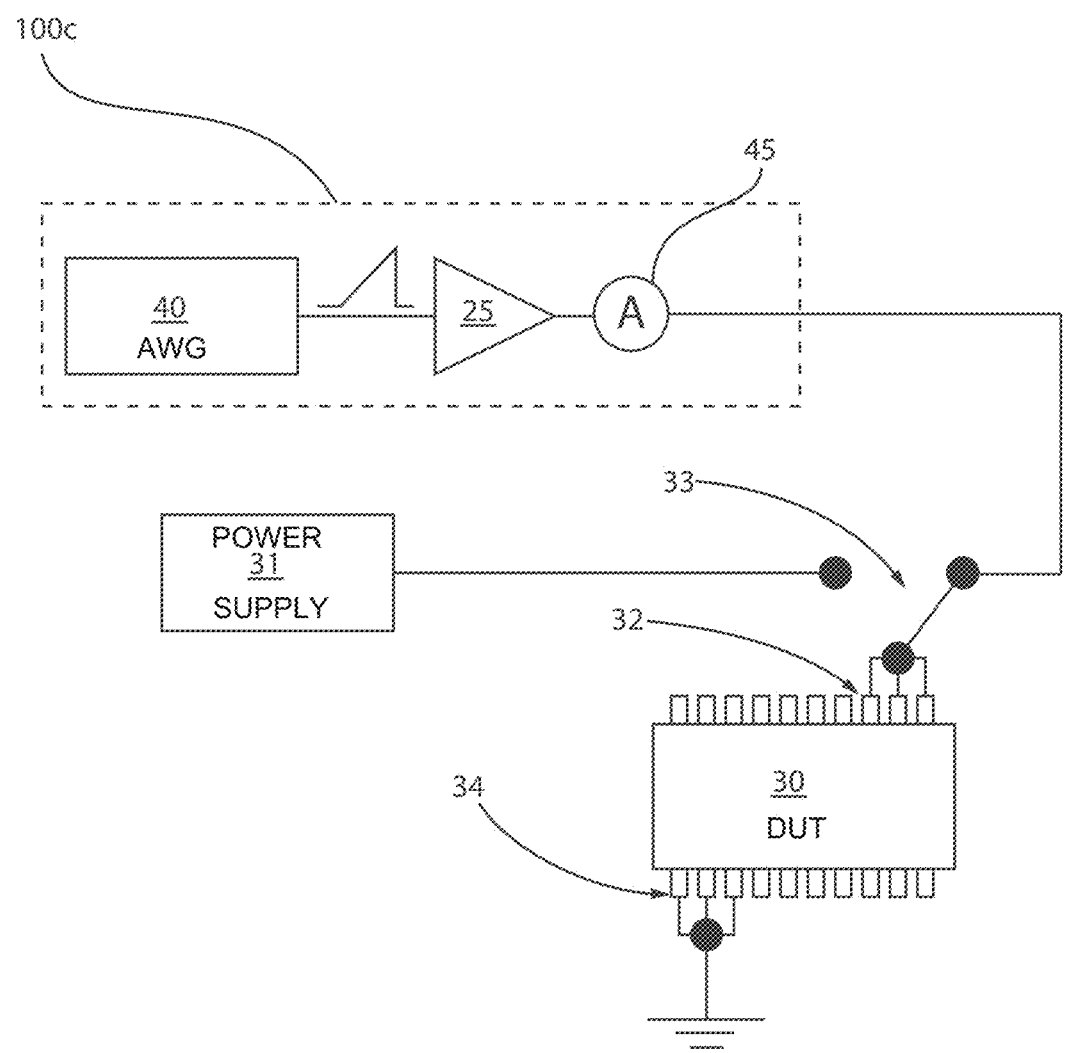
FIG. 6 is a schematic view depicting one embodiment of the connection of the power on burst noise (POBN) test system to the pins of an integrated circuit, in accordance with the present disclosure.

At step 70 of the process flow depicted in FIG. 5, the power supply voltage (Vdd) to the integrated circuit is ramped to produce a power on burst noise (POBN) spectra using the waveform generator 40 and amplifier 35 of the POBN test system. The power supply voltage (Vdd) is ramped from a value below the threshold voltage (Vt) for each of the field effect transistors in the integrated circuit to value above the threshold voltage (Vt) for each of the field effect transistors in the integrated circuit.

For example, the power supply voltage (Vdd) may be ramped from a starting voltage of 0 volts. The power supply voltage (Vdd) may be ramped to a final voltage ranging from 1.0 volts to 3 volts. In another embodiment, the power supply voltage (Vdd) may be ramped to a final voltage ranging from 1.5 volts to 2.5 volts. In one example, the power supply voltage (Vdd) may be ramped to a final voltage that is on the order of 2.0 volts. It is noted that the above noted voltages are provided for illustrative purposes only, and are not intended to limit the present disclosure. Other suitable bias voltages may be employed depending on the nominal design point for the chip.

Acquisition of the power on burst noise (POBN) spectra is typically fast. For example, one complete voltage ramp, also referred to as voltage sweep, may range from 5 ms to 20 ms. In another example, the complete voltage ramp may be on the order of 10 ms. In one example, the power supply voltage (Vdd) may be ramped to increase the applied power supply voltage (Vdd) as a function of time with a rate ranging from 0.01 volts/second to 1000 volts/second. However, it is understood that voltage ramp rates outside of this range may also be usable for POBN spectra. In another embodiment, the power supply voltage (Vdd) may be ramped to increase the applied power supply voltage (Vdd) as a function of time with a rate ranging from 10 volts/second to 100 volts/second.

Figure 7:
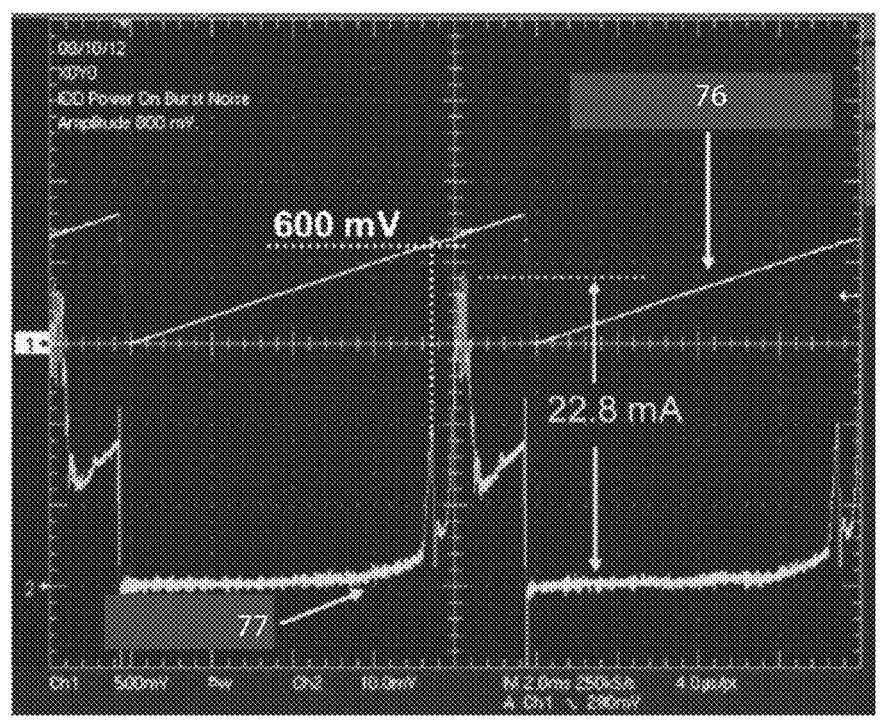
FIG. 7 is a power on burst noise (POBN) plot depicting multiple peaks, in which each peak corresponds to a family of transistors in an integrated circuit including a plurality of transistor families, in accordance with one embodiment of the present disclosure.

At step 75 of the process flow that is depicted in FIG. 5, the power supply current (Idd) is measured for the integrated circuit during ramping of the power supply voltage (Vdd). In some embodiments, measuring the power supply current (Idd) from the integrated circuit employs the ammeter 45 and the digitizer 50 of the power on burst noise (POBN) test system that is depicted in FIG. 4. The measurement of the power supply current (Idd) is concurrently taken with the ramping of the power supply voltage (Vdd) to generate a power on burst noise (POBN) spectra. The power on burst noise (POBN) spectra is a plot of the power supply current taken from the pins of the integrated circuit as the power supply voltage (Vdd) is ramped from below the threshold voltage (Vt) of the transistors in the integrated circuit to above the threshold voltage of the transistors in the integrated circuit. Peaks in the plot of the measured power supply current (Idd) are pulses indicating a condition in which all of the transistors in the integrated circuit, such as the NFET and PFET transistors in a CMOS device arrangement, are in an "ON" state. In some embodiments, in which the integrated circuit employs multiple families of transistors within the integrated circuit, the power on burst noise (POBN) spectra may include multiple peaks, i.e., pulses, wherein each peak corresponds to each family of transistors within the integrated circuit. One example of a power on burst noise (POBN) spectra including multiple peaks corresponding to multiple families of transistors is depicted in FIG. 7. In FIG. 7, the plot identified by reference number 76 is the applied power supply voltage (Vdd), and the plot identified by reference number 77 is the measured power supply current (Idd).

In some embodiments, the process flow may include a single voltage sweep, i.e., single ramp of the power supply voltage (Vdd), or the process flow may include multiple voltage sweeps, i.e., multiple ramps of the power supply voltage (Vdd). The decision of whether the method for characterizing the integrated circuit includes a single voltage sweep or multiple voltage sweep is at step 80 of the process flow that is depicted in FIG. 5. In the embodiments, in which a single voltage sweep is employed, only the measured power supply current (Idd) that is measured during the single voltage sweep provides the power burst noise (POBN) spectra for use in the process flow. In the embodiments, in which multiple voltage sweeps are conducted, the power supply current (Idd) that is measured for each of the multiple voltage sweeps is averaged to provide an average power on burst noise (POBN) spectra. In some examples, the number of voltage sweeps may be on the order of 100. The average power on burst noise (POBN) spectra is then used for comparison with a reference power on burst (POBN) spectra to determine the fitness of the integrated circuit. For multiple sweep experiments, we note that the statistics of the power supply current (Idd) values acquired at each voltage during each sweep may also be collected, in addition to simply computing the average power supply current (Idd) value at each voltage. The variation of the power supply current (Idd) at each voltage bias may also provide useful information in determining the fitness of the integrated circuit, as well as an identifying electronic fingerprint.

At step 85 of the process flow depicted in FIG. 5, the peaks in the measured power supply current (Idd) of the power on burst noise (POBN) spectra for the integrated circuit are compared to reference peaks for a reference power on burst noise (POBN) spectra for a reference circuit in order to determine the fitness of the integrated circuit. The reference circuit has the same functionality as the integrated circuit. By determining the fitness of the integrated circuit it is meant that a determination is made of the hours on power that the integrated circuit has been subjected to and/or whether counterfeit devices, such as counterfeit transistors, are present in the integrated circuit.

The threshold voltage (Vt) shift due to use (power on hours) in the design under test (DUT) can be quantified by measuring the voltage positions of the power on burst noise (POBN) peaks for a part with unknown history, and comparing this spectrum with one acquired from a virgin sample. In some embodiments, the area of the curve corresponding to each of the peaks for the power supply current in the power on burst noise (POBN) spectra is correlated to a distribution of threshold voltage (Vt) for a family of at least one NFET and at least one PFET in the integrated circuit. The narrower the peak, the lesser the area of the curve, and the narrower the distribution of the threshold voltage (Vt) of the transistors. The broader the peak, the greater the area of the curve, and the greater the distribution of the threshold voltage (Vt) of the transistors. It has been determined, that the greater the power on hours for the transistors in the integrated circuit, the greater the likelihood that the threshold voltage (Vt) may vary for transistors in the integrated circuit. This results in a broader distribution of threshold voltage (Vt) for the transistors in the integrated circuits. Therefore, the number of power on hours for an integrated circuit can be determined by comparing the peaks in the measured power supply current (Idd) of the power on burst noise (POBN) spectra for the integrated circuit to the reference peaks for a reference power on burst noise (POBN) spectra for the reference circuit. In addition, the health of critical components within a system might be monitored by periodically measuring their power on burst noise (POBN) spectrum.

In another embodiment, by determining the fitness of the integrated circuit it is meant that a determination on whether counterfeit devices, such as counterfeit transistors, are present in the integrated circuit. Integrated circuits that are manufactured by different suppliers will have different threshold voltage (Vt) distributions, because of process implementation differences between different fabrication facilities. This means that functionally equivalent parts can be uniquely identified by their manufacturer by comparing the threshold voltage (Vt) distribution of a part in question against a known reference library of part threshold voltage distributions. Further, the addition of a counterfeit element into the integrated circuit may result in a peak on the power on burst noise (POBN) spectra that is not consistent with the peaks of a reference power on burst noise (POBN) spectra.

In another aspect of the present disclosure, a method of determining the fitness of the integrated circuits (IC) is provided, such as whether the integrated circuits contain counterfeit structures, which employs measurements of light emissions to determine integrated circuit (IC) fitness. Counterfeit parts or structures may include components in which there has been a misrepresentation of the parts identity, e.g., incorrect manufacturer, incorrect part number, incorrect date code, and incorrect lot code. In other examples, counterfeit parts or structures may include components that have been copied or cloned, .e.g., reverse engineered, so that the parts may not perform to OEM specifications. In other examples, the counterfeit parts detected by the methods disclosed herein may be used parts that are recycled and sold as new, or defective parts sold as new or working used parts. In yet other examples, the counterfeit parts detected by the methods disclosed herein may be fake parts that do not function, e.g., incorrect die or no die at all.

In some embodiments, the methods and structures that are disclosed herein may be particularly helpful to determine the presence of counterfeit used parts that are being sold as new parts within an integrated circuit (IC). This type of counterfeit is generally difficult to detect, and when not detected typically has a higher risk of vulnerability once deployed into the system.

Typically, as a FET (field effect transistor) ages, its threshold voltage ($V_t$) increases. Therefore, with increasing threshold voltage (Vt), the driving capability of the field effect transistor (FET) drops. Eventually, an integrated circuit (IC) built with field effect transistors (FETs) will slow down due to aging. Therefore, one can propose a method for detecting the aged integrated circuit (IC) by measuring its speed. But, in some instances, the problem is that there is often no integrated circuit (IC) that can be used as a reference. In some scenarios, one does not know how fast an integrated circuit (IC) can run. In fact, variations in maximum speed of operation are expected due to process variability.

In some embodiments, a novel counterfeit integrated circuit (IC) detection method is provided that is based on the detection of the intrinsic light emission that is emitted from powered devices, specifically the leakage light emission, when a device in an OFF state. For example, the methods disclosed herein use the light emission that is intrinsically emitted from the channel of field effect transistors (FETs) to detect the presence of counterfeit integrated circuits (ICs). As stated earlier, the threshold ($V_t$) of the field effect transistor (FET) increases while it ages. For an integrated circuit (IC) that has been used or stressed for a long time, its associated FETs' threshold voltages have been shifted due to NBTI effect (Negative Bias Temperature Instability) for PFET and PBTI effect (Positive Bias Temperature Instability) for NFET devices. It is also a basic principle that leakage light emission strongly depends on device characteristics, e.g., FET's threshold voltage. The light emission (leakage light) strongly depends on the devices threshold voltage. More specifically, in some embodiments, the greater the threshold voltage (Vt) is, the lower the leakage light will be. Therefore, the corresponding light emission intensity changes in response to changes in threshold voltage, and this effect can be utilized in some embodiments to detect counterfeit parts.

There is also a fact that not every device, or FET, on the same chip gets the same rate of stress when normally used. For example, some of the devices, e.g., FETs, in the integrated circuit (IC) switch often, and some of the devices never switch. Thus, it is possible to identify counterfeit integrated circuits (IC) by measuring two similar size FETs which are subjected to different level of stress. From the description of the integrated circuit (IC), the I/O activities of the integrated circuit (IC) components can be determined, and therefore a determination can be made for which of the field effect transistors (FETs) in the integrated circuit (IC) will be used to measure the light emission.

By comparing similar field effect transistors (FETs) with different aging factors in the same integrated circuit (IC), a determination can be made to tell if the integrated circuit (IC) has aged and/or includes counterfeit components without the need for a reference integrated circuit (IC). This methods disclosed herein are non-invasive and inspection of the integrated circuit (IC) for measuring light emission in some instances only needs an exposed backside of the integrated circuit (IC) for camera detection. After inspection, the integrated circuit (IC) remains fully functioning, and can be treated as a normal chip, if it is not a counterfeit.

In some embodiments, the reliability degradation that is due to bias temperature instability (BTI) that causes FET (field effect transistor) threshold voltage shift can be empirically modeled as:

$$\Delta V_T = At^n V^m \exp[-Ea/kT] \quad \text{(Equation 1)}$$

in which $V_T$ is the threshold voltage, A is a scaling factor, t is time, V is applied voltage, Ea is activation energy, k is the Boltzmann constant, and T is the temperature. Equation 1 clearly illustrates that the threshold voltage ($V_T$) of a given device will be increasing with increasing the time of usage ($\Delta V_T$ increases as t increases as well as voltage being applied) of the integrated circuit (IC). Therefore, because the threshold voltage ($V_T$) of the device increases with the time of usage, as the device usage continues, the device will eventually slow down. Also, the light emission due to leakage current is a function of the devices threshold voltage ($V_T$), as illustrated in equation 2, as follows:

$$L(E) = Af(-\Delta V_T) \quad \text{(Equation 2)}$$

where L(E) is the light intensity, A is a scaling factor, and f is monotic function of $\Delta V_T$. The above described light emission may also be referred to as leakage emission or light emission from off state leakage current. As illustrated in equation 2, the higher the threshold voltage (Vt), the lower the light emission for the device, i.e., field effect transistor (FET).

From the above described relationship between the stress applied to a device, e.g., number of hours it has been powered on etc., leakage emission, and threshold voltage ($V_t$) that is illustrated above with reference to Equations 1 and 2, one can determine if an integrated circuit (IC) has been used for a long time or not, by measuring the leakage emission from the channel region of the field effect transistors (FETs) within the integrated circuit (IC). The leakage emission measured from an integrated circuit (IC) being tested may be compared with the leakage emission measured from a reference integrated circuit (IC). The reference point from with the leakage emission measurement is taken may be referred to as the $T_0$ emission. However, often there is no reference integrated circuit (IC) available to be compared against. In these instances, a reference structure, i.e., a field effect transistor (FET), from the same integrated circuit (IC) is selected for measuring a first leakage emission, for comparison with the leakage emission that is taken from other structure, i.e., field effect transistors (FET), within the same integrated circuit (IC).

For any given integrated circuit (IC) chip, not all the devices on the chip will degrade at the same rate due to two facts. First, it is typical that not all the devices, e.g., field effect transistors (FETS), within the integrated circuit (IC) have the power supply voltage (Vdd) fully biased to them based on the operating conditions. In this case, according to Equation 1, the devices that have been biased to the full power supply voltage (Vdd) will have their threshold voltages (Vt) degrade more. Further, FETs recover from degradation when the power supply voltage (Vdd) is not biased to them. For these devices, the threshold voltage (Vt) will change less than the one of FETs that are always on. Therefore, by selecting the devices from the device under test, e.g., selecting one heavily stressed device, and one device that is less stressed or not subjected to stress, and by measuring the corresponding emission light, e.g., leakage emission, one can tell if the chip has been stressed or not.

FIGS. 8a and 8b depict the static emission conditions for an inverter. In FIGS. 8a and 8b, the field effect transistor (FET) identified by reference number 100a is a p-type field effect transistor (PFET), and the field effect transistor identified by reference number 100b is an n-type field effect transistor (NFET). In FIG. 8a, the input to the inverter is "0", and the output is "1", whereas in FIG. 8b, the input to the inverter is "1" and the output is "0". LEOSLC stands for Light Emission from Off State Leakage Current, which is an intrinsic light emission 101a, 101b produced by leakage current under the "OFF" state condition of a switching device, such as a field effect transistor, e.g., PFET 100a and/or NFET 100b. For instance, LEOSLC 101b from an NFET 100b occurs while its gate voltage is at logic "0" (OFF state), while LEOSLC 101a from a PFET 100a emits when its gate voltage is at logic "1" (OFF state). LEOSLC 101a, 101b strongly depends on device's threshold voltage (Vt). There is another type of light emission, which may be referred to as switching light emission, that is due to the photons emitted by the hot carriers accelerated by the source-drain field in the pinch-off region of channel when the FET is in saturation.

FIG. 9a depicts one embodiment of a plot of the emission intensity as a function of time for the PFET 100a of the inverter depicted in FIGS. 8a and 8b. As illustrated in FIG. 9a, when the input to the inverter is set to "0", the PFET 100a is in the ON state, and there is limited or no emissivity from the PFET 100a, because its drain to source voltage is close to zero. At approximately 3.0 nanoseconds, the input to the inverter depicted in FIGS. 8a and 8b is changed to "1". The switch to "1" turns the NFET 100b to an ON state, and turns the PFET 100a to an OFF state. In the time period ranging from 3.0 nanoseconds to approximately 8.0 nanoseconds, during which the PFET 100a is in the OFF state, Light Emission Off State Leakage Current (LEOSLC) 101b is emitted from the PFET 100a, as indicated by region 103 of the plot depicted in FIG. 9a, and illustrated in FIG. 8b. At the end of the region 103 for the LEOSLC 101b, a transition light emission is emitted from the PFET 100a, as illustrated by the peak identified by reference number 104 in FIG. 9a. This may also be referred to as the input falling edge. Following the input falling edge, the input to the inverter depicted in FIGS. 8a and 8b is changed to "0", which switches the PFET 100a to an ON state, and there is limited emissivity from the PFET 100a, as illustrated by the region of the plot depicted in FIG. 9a extending from greater than 8.0 nanoseconds to 12.0 nanoseconds.

FIG. 9b depicts one embodiment of a plot of the emission intensity as a function of time for the NFET 100b of the inverter depicted in FIGS. 8a and 8b. FIG. 9b. illustrates the emissivity phenomena that is experienced by the NFET 100b simultaneously with the above described emissivity phenomena that is experienced by the PFET 100a. As illustrated in FIG. 9b, when the input to the inverter is set to "0", the NFET 100b is in the OFF state, so that Light Emission Off State Leakage Current (LEOSLC) 101a is emitted from the NFET 100b, as indicated by region 106 of the plot depicted in FIG. 9b and illustrated in FIG. 8a. This period of Light Emission Off State Leakage Current (LEOSLC) 101a from the NFET 100b at which the input is set to "0" is for a period up to approximately 3.0 nanoseconds, as depicted in FIG. 9b. At approximately 3.0 nanoseconds, a switching light emission pulse may be emitted from the NFET 100b as illustrated by the peak identified by reference number 105 is FIG. 9b. This may also be referred to as the input falling edge. The peak for the input rising edge for the NFET 100b is usually greater than the peak for the input falling edge for the PFET 100a due to the low hole mobility of the carriers in the PFET 100a. Following the input falling edge, the input to the inverter may be changed from "0" to "1". The switch to "1" turns the NFET 100b to an ON state, and turns the PFET 100a to an OFF state. In the time period ranging from 3.0 nanoseconds to approximately 8.0 nanoseconds, during which the NFET 100b is in the ON state, there is limited emissivity from the NFET 10ba. This period of low emissivity from the NFET 100b, at which the input is set to "1", is for a period 107 ranging from a time of 3.0 nanoseconds to 8.0 nanoseconds, as depicted in FIG. 9b. Following this period of low emissivity, the input to the inverter may be changed from "1" to "0". The switch to "0" turns the NFET 100b to an OFF state, and turns the PFET 100a to an ON state. Light Emission Off State Leakage Current (LEOSLC) 101a is emitted from the NFET 100b, as indicated by region 108 of the plot depicted in FIG. 9b, which extends from greater than 8.0 nanoseconds to 12 nanoseconds.

The leakage emission, e.g., Light Emission Off State Leakage Current (LEOSLC) 101a, 101b, may be detected optically. For example, the leakage emission may be detected using a camera, such as a digital camera having a sensor that converts light into electrical charges. For example, the camera for measuring the leakage emission may be a charge coupled device (CCD) camera or complementary metal oxide semiconductor (CMOS) image sensor. In another embodiment, the leakage emission, e.g., Light Emission Off State Leakage Current (LEOSLC) 101a, 101b, may be measured using a Indium Gallium Arsenide (InGaAs) camera, which may also be referred to as a InGaAs detector. In some embodiments, the light emission may be measured from the chip backside, through its Silicon substrate.

Figure 10A:
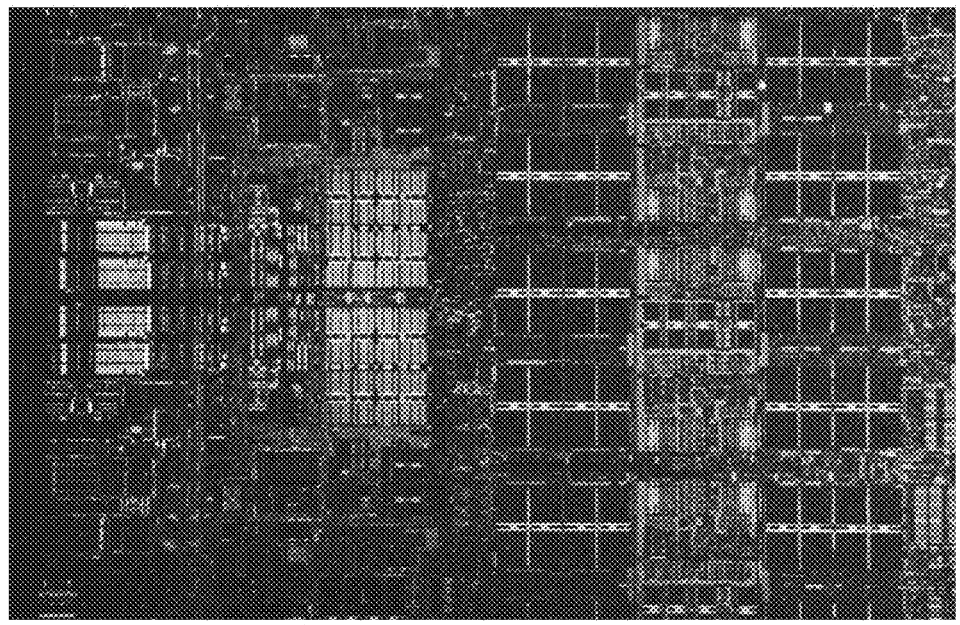
FIG. 10a is an image of an emission map taken from a camera taking the image from a microprocessor that has been powered on, but is not operating, in accordance with one embodiment of the present disclosure.
Figure 10B:
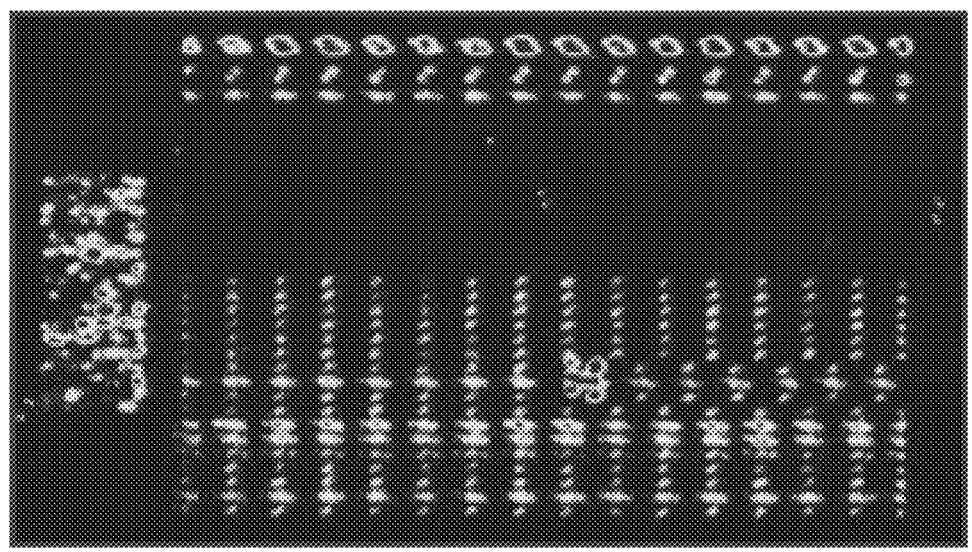

FIG. 10a is an image of an emission map taken from a camera, such as a charge coupled device (CCD) camera, complementary metal oxide semiconductor (CMOS) image sensor, and/or InGaAs camera, taking the image from a microprocessor that has been powered on, but is not operating. In this image, only LEOSLC is observed because chip is only powered on, i.e., the chip is not operating. For example, the image depicted in FIG. 10a has a field of view of approximately 1 mm by 2 mm. FIG. 10b is a magnified view of the integrated circuit (IC) from the emission map depicted in FIG. 10a, in which individual devices, such as field effect transistors (FETs), can be observed and distinguished. In FIG. 10b the image has a pixel resolution of on the order of 1 micron.

Figure 11A:
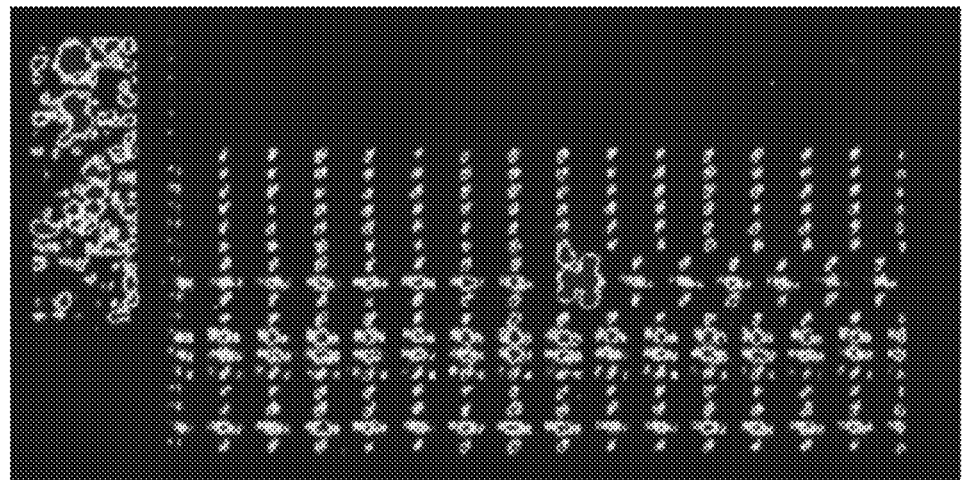
FIGS. 11a and 11b are emission maps taken from a microprocessor showing the different emission signatures that can be measured from devices with different threshold voltages (Vts).
Figure 11B:

FIGS. 11a and 11b are emission maps taken from a microprocessor using an optical camera, e.g., charge coupled device (CCD) camera, complementary metal oxide semiconductor (CMOS) image sensor, and/or InGaAs camera, showing the different emission signatures that can be measured from devices with different threshold voltages (Vt). For example, FIG. 11a is an emission map showing high levels of emission from semiconductor devices, e.g., FETs, having a low threshold voltage (Vt). FIG. 11b is an emission map from a region of the chip with low emission from semiconductor devices, e.g., FETs, having a high threshold voltage (Vt). In these two images, the types of gates and sub-circuits are identical in their geometry, size and supply voltage differ because of the threshold voltage of the transistors in the gate.

Figure 12A:
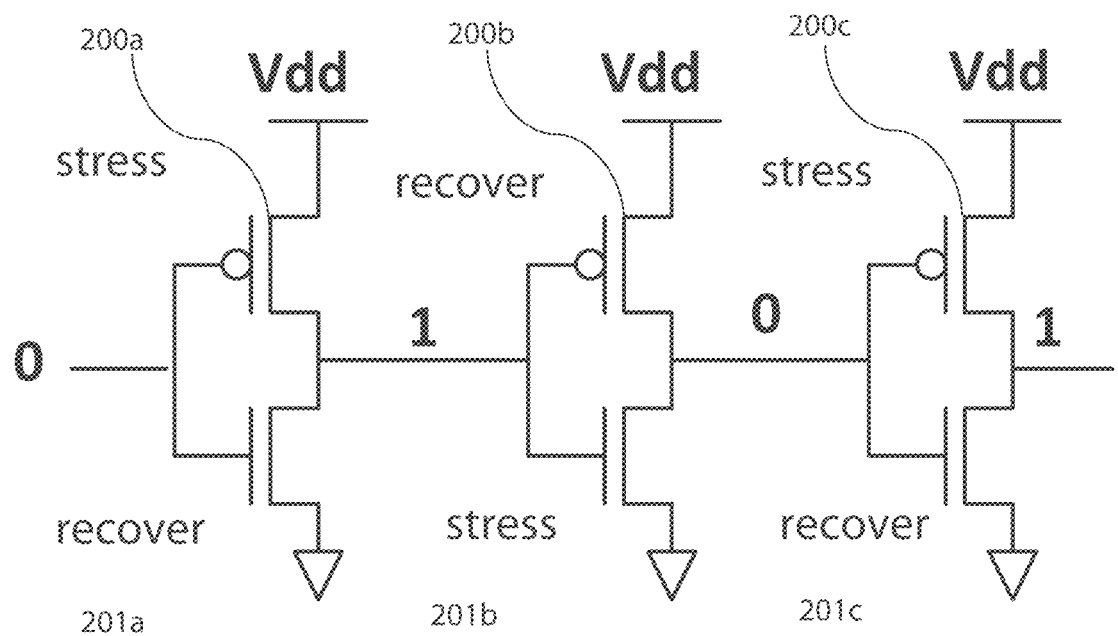
FIG. 12a is a circuit diagram of an inverter chain and the corresponding stress and recover states under a first input sequence of "0", "1", "0", "1", in accordance with one embodiment of the present disclosure.
Figure 12B:
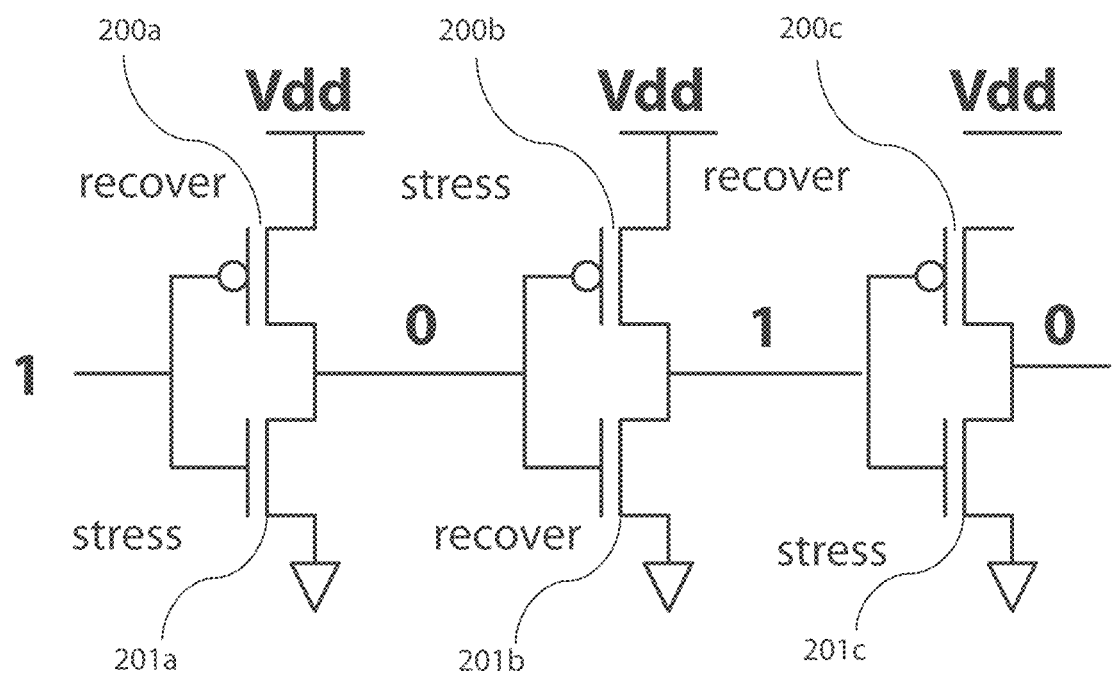
FIG. 12b is a circuit diagram of an inverter chain and the corresponding stress and recover states under a second input sequence of "1", "0", "1", "0", in accordance with one embodiment of the present disclosure.

FIGS. 12a and 12b show diagrams of inverter chains and the corresponding stress and recover states under different inputs. For example, in FIG. 12a, when the input is logic "0", the PFETs 200a, 200c of first stage and last stage get stressed along with second stage NFET 201b. The remaining PFETs 200b, and NFETs 201a, 201b that are not stressed are under the recover condition. FIG. 12b illustrates the stress and recover conditions of the inverter chain having an opposite input of the input to the inverter chain illustrated in FIG. 12a. In FIG. 12b, when the input is logic "1", the PFETs 200a, 200c of first stage and last stage are under the recover condition along with second stage NFET 201b. The stressed devices when the input is logic "F", as depicted in FIG. 12b, include PFETs 200b, and NFETs 201a, 201b.

As illustrated by the embodiments depicted in FIGS. 12a and 12b, if the input to this chain is switching, all the devices, i.e., PFETs 200a, 200b, 200c and NFETs 201a, 201b, 201c, will be in alternating stress and recover states. Therefore, the devices, e.g., PFETs 200a, 200b, 200c and NFETs 201a, 201b, 201c, will be aged equally. During regular operating conditions of an integrated circuit (IC), there are circumstances where a certain type of gate spends most of its time in a high stress condition, while another identical gate spends most of its time in a low stress condition. For example, a static gate may be in either high or low stress condition all the time, while a switching gate may be in an intermediate stress condition depending on its switching activity.

Therefore, specific devices could be stressed much harder than a remainder of devices in the integrated circuit (IC). In some embodiments, it is desirable to identify these highly stressed devices, and use them to compare with less stressed devices in order to create a differential method for aging detection. Usually, from the integrated circuit (IC) specification, it can be determined which IO pin is switching and which pin is held static. The latter IO pin will be characterized by either a high or low stress level, while the former switching IO will suffer an intermediate amount of stress depending on the switching activity of the particular pattern signal that exercise it.

Figure 13:
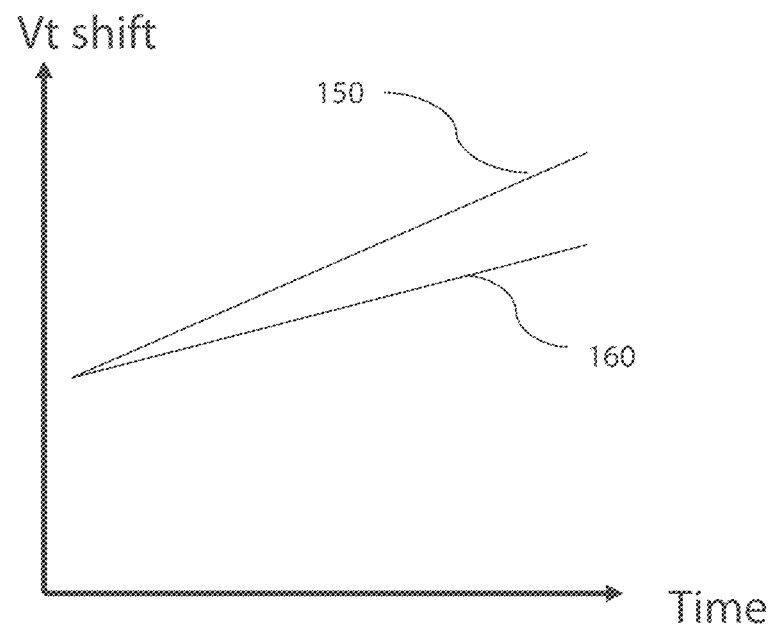
FIG. 13 is a plot of threshold voltage (Vt) shift as a function of time for an integrated circuit under constant stress in comparison to an integrated circuit subjected to periods of stress and recovery, in accordance with one embodiment of the present disclosure.

FIG. 13 is an explanatory plot of threshold voltage (Vt) shift as a function of time for an integrated circuit (IC) under constant stress in comparison to an integrated circuit (IC) subjected to periods of stress and recovery (as described above with reference to FIGS. 12a and 12b). FIG. 13 compares the threshold voltage (Vt) shift with increasing time for continuously stressed devices, as illustrated by plot 150, and devices that have periods of being stressed with recovery periods, as illustrated by plot 160. As illustrated in FIG. 13, the devices that are under a constant stress (illustrated by plot 150) exhibit a greater threshold voltage shift (Vt) than devices subjected to periods of stress and recovery (illustrated by plot 160).

Figure 14:
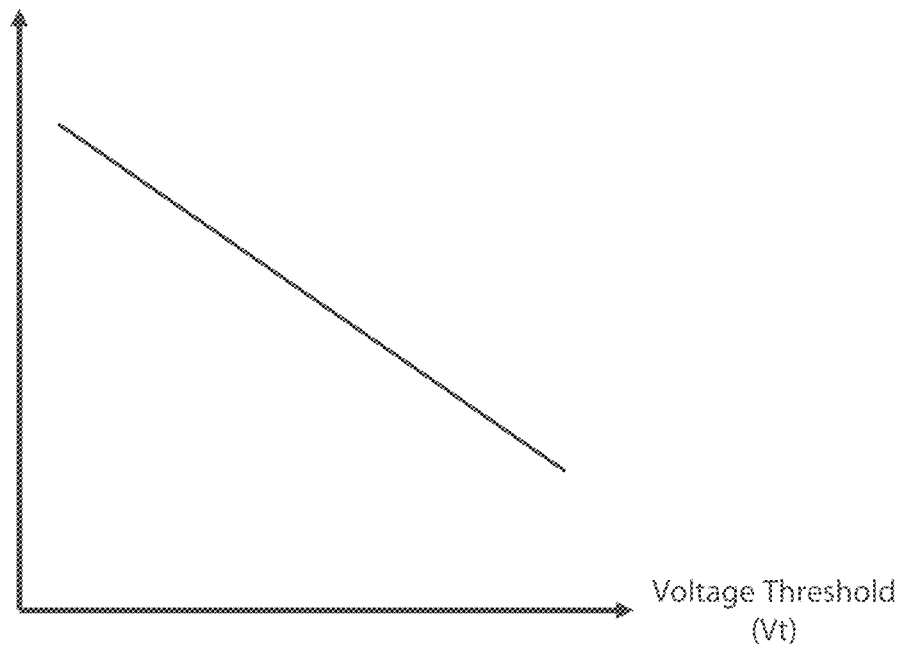
FIG. 14 is a plot of light emission vs. changes in threshold voltage (Vt) in an integrated circuit.

FIG. 14 is a plot of light emission vs. changes in threshold voltage (Vt) in an integrated circuit. The higher the threshold voltage (Vt), the less the light emission. By combining the concepts of FIG. 13 with FIG. 14, one can understand that as the threshold voltage (Vt) shift of devices affected by different amount of stress becomes more and more different with a longer use time of chip, so does the difference in emission signature between the same two devices. Furthermore, since there is an strong relationship between threshold voltage (Vt) shift and emission, any difference in degradation between two FETs is greatly amplified through its emission signature.

Figure 15:
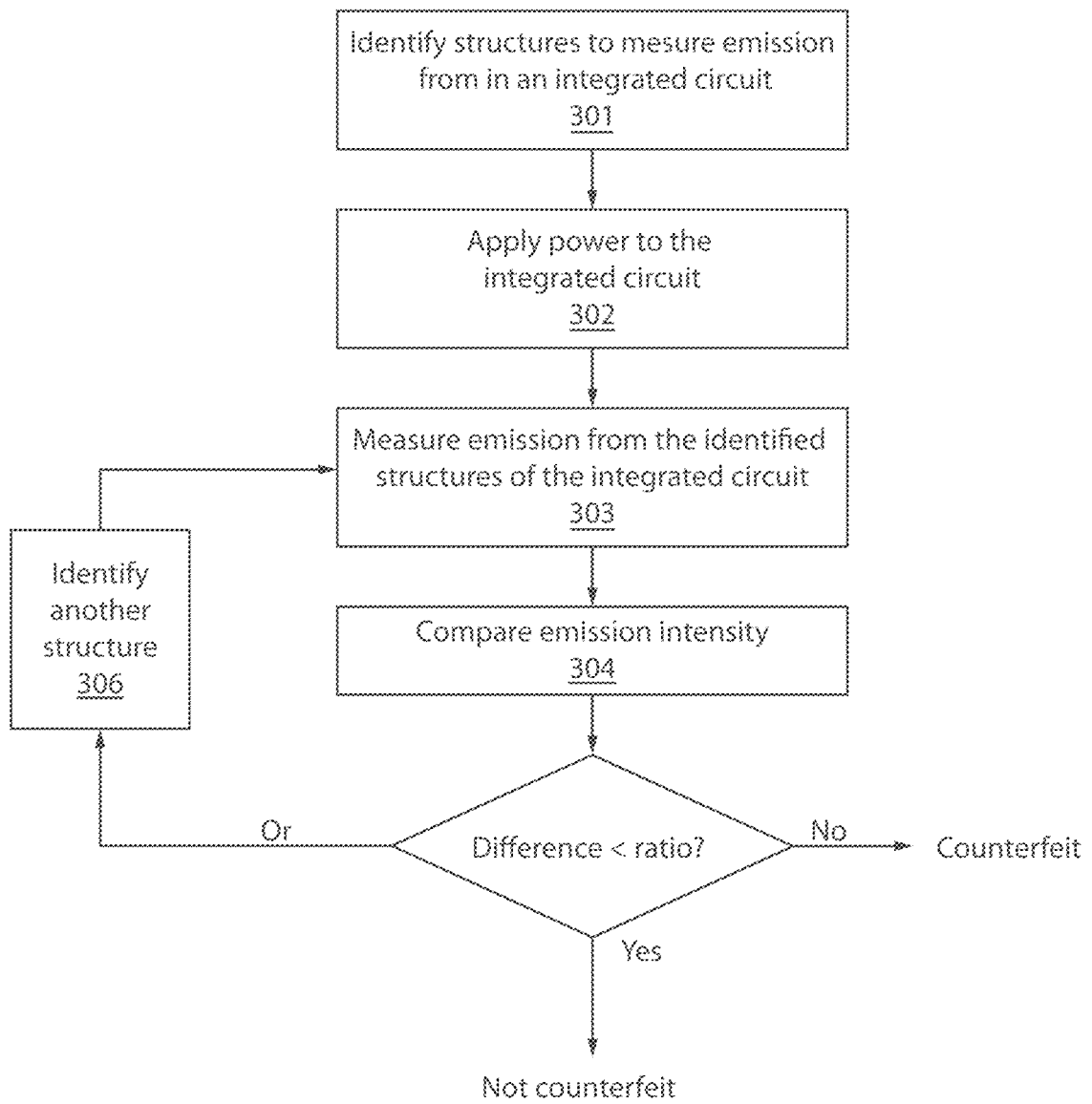
FIG. 15 is a flow diagram for a method of characterizing an integrated circuit by detecting leakage emission, in accordance with one embodiment of the present disclosure.

FIG. 15 is a flow diagram for one embodiment of a method of characterizing an integrated circuit (IC), e.g., identifying a counterfeit chip/integrated circuit, by detecting leakage emission. First, at step 301, the method may begin by identifying structures of interest, e.g., field effect transistors (FETs), that have been subjected to different levels of stress. In one embodiment, structures may be selected from the integrated circuit (IC) by examination of the integrated circuit (IC) specification. For example, from the integrated circuit (IC) specification, the input/outputs (IOs) for the integrated circuit (IC) that get static logic state (e.g., control signals), as well as switching states (i.e. clocks inputs), can be identified. For example, it is possible to find the devices, e.g., FETs, that have been fully stressed and other devices have not been subjected to stress due to the nature of how the integrated circuit (IC) is operated. One example for identifying devices within an integrated circuit (IC) for comparison is to determine from the integrated circuit (IC) specification, which IOs get clock signal, and which IOs get stability signals. In some examples, for the IOs that get clock signal, the corresponding IO circuitries normally have half stress and half recover times, while the IOs that run stability signals either always get stressed, or always get recovered (no stress), depending on the applied polarity. One can pick devices from different running conditions, e.g., a fully stressed FET and a lightly stressed FET, and use them for comparison in a differential approach. In one example, one I/O device, e.g., FET, is picked that is under constant stress, e.g., is subjected to a static logic state, for comparison with another I/O device, e.g., FET, that is subjected to substantially half stress and half recover times, e.g., is subjected to a clock signal. An I/O device that is subjected to substantially half stress and half recover times, e.g., is subjected to a clock signal, is one example of a device that is subjected to a variable, i.e., non-constant, stress state.

In some embodiments, the goal is to identify the devices that have continuous stress and less (recover) stress. As depicted in FIG. 11b, there are devices that are never stressed during the operation of the integrated circuit (IC). In some examples, these devices, i.e., lowly stressed devices or no stress devices, may serve as reference device from which the emissivity can be measured to compare with the measured emissivity from highly stressed devices, e.g., devices that are constantly stressed, e.g., subjected to a static logic signal.

Typically, the devices chosen for comparison of the measured emissivity need to be the same types of circuits/gates to simplify the comparison. By being of the same type it is meant that the devices will have the same functionality, e.g., same polarity (p-type or n-type), same geometry, and/or same size, and connections.

At step 302 of the method illustrated in FIG. 15, power, e.g., the power supply voltage (Vdd), is applied to the integrated circuit (IC). The power that is applied to the integrated circuit (IC) is only so that the integrated circuit (IC) is powered on, but is not operating. Because the integrated circuit (IC) is only powered on, but is not operating, the only light emission from the devices of the integrated circuit results from the Light Emission Off State Leakage Current (LEOSLC).

In some embodiments, light emissions are measured from the identified devices or logic gates at step 303. For example, in one embodiment, light emission, such as Light Emission Off State Leakage Current (LEOSLC), is measured from the logic gates of the I/O device that is under constant stress state, e.g., a FET subjected to a static logic state, and the logic gates of the I/O device that are not subjected to stress. In another embodiment, light emission, such as Light Emission Off State Leakage Current (LEOSLC), is measured from the logic gates of the I/O device that is under constant stress state, e.g., a FET subjected to a static logic state, and the logic gates of the I/O device that is subjected to a variable, i.e., non-constant, stress state, e.g., a FET subjected to a clock signal. Light emission, such as LEOSLC emissions, may be measured using the optical methods that have been described above, such as charge coupled device (CCD) camera, complementary metal oxide semiconductor (CMOS) image sensor, and/or InGaAs camera. Besides having the backside of an integrated circuit (IC) exposed for camera access, this method is non-invasive. A key advantage of the proposed method relates to the fact that, after the analysis is completed, integrated circuits may still fully function. Therefore they may be used for normal applications, possibly after being repackaged.

Referring to step 304 of the method depicted in FIG. 15, the emission intensity that is measured from the identified devices or logic gates at step 303 are then compared to one another to determine whether the difference between the measured emission intensity is large enough to indicate the existence of a counterfeit device and/or a device with enough power on hours that degraded the device's performance to unacceptable levels. Comparison of emission intensity could either be performed on-the-fly or by post-process, depending on the tool and software capability. An emission ratio between two devices is considered large enough to suggest a counterfeit integrated circuit (IC) when it exceeds the measurement error bar. The error includes emission fluctuations due to random and systematic variability across the chip, temperature difference between the devices, camera noise and ambient noise.

At step 305, using a pre-defined ratio, one can decide if the integrated circuit (IC) has been used for a long time or not, and/or whether a counterfeit integrated circuit (IC) or not. For an aged integrated circuit (IC), the ratio of the emission between the "stressed" and "less stressed" or "none stressed" will be substantial.

To increase the confidence level, one can measure the light emission, e.g., LEOSLC emission, of another device for further comparison at step 306. The whole procedure illustrated in FIG. 15 can be fully automated by pre-defining parameters, such as physical locations of devices and imaging process, etc.

In some embodiments, the method described above with reference to FIG. 15 provides a method for characterization of an integrated circuit that does not require a separate reference integrated circuit (IC) for determining whether an integrated circuit (IC) has a below specification performance, e.g., whether devices included within the integrated circuit (IC) are counterfeit or have an increased threshold voltage from excessive stress, such as a high level of on power hours.

It is noted that the method for characterizing integrated circuits (ICs) by measuring light emission, as described with reference to FIG. 15, may be used in combination with the power on burst noise (POBN) test that is described above with reference to FIG. 5. In some embodiments, the method for characterizing integrated circuits (ICs) by measuring light emission, as described with reference to FIG. 15, is used to determine whether an integrated circuit (IC) is suitable to provide the reference integrated circuit (IC) for providing the reference power on burst noise (POBN) spectra that is employed in step 85 of method for characterizing integrated circuits (ICs) by power on burst noise (POBN) test that is described above with reference to FIG. 5. This is especially useful when a known reference chip of suitable functionality is not available. In particular, the method for characterizing integrated circuits (ICs) by measuring light emission, as described with reference to FIG. 15, could be used to verify if a certain (unknown) integrated (IC) is counterfeit or not. By this procedure, the tested integrated circuit (IC) may be found suitable, i.e., operating at the expected performance specification, and therefore could be used a reference device for the power on burst noise (POBN) test that is described above with reference to FIG. 5. In this sense, the chip that was found good, i.e., operating at the expected performance specification, by the method for characterizing integrated circuits (ICs) by measuring light emission could undergo the power on burst noise (POBN) test to generate the reference signature, i.e., the reference power on burst noise (POBN) spectra that is employed in step 85 of power on burst noise (POBN) test depicted in FIG. 5. Once the reference power on burst noise (POBN) spectra is established, the power on burst noise (POBN) test method that is described above with reference to FIG. 5 may be systematically applied to a large quantity of other integrated circuit (IC) chips to determine whether the integrated circuit (IC) chips that are being tested are counterfeit or not. For example, when the integrated circuit (IC) chips have a matching signature, i.e., power on burst noise (POBN) spectra, to the reference power on burst noise (POBN) spectra, the integrated circuit being tested is not a counterfeit. For example, when the integrated circuit (IC) chips that are being tested have a non-matching signature, i.e., power on burst noise (POBN) spectra, to the reference power on burst noise (POBN) spectra, the integrated circuit being tested is a counterfeit.

In another embodiment, if the method for characterizing integrated circuits (ICs) by measuring light emission finds the integrated circuit being measured to be counterfeit, then the counterfeit integrated circuit can then be used in the power on burst noise (POBN) test to create a power on burst noise (POBN) signature of a counterfeit chip. In this example, the power on burst noise (POBN) signature that is taken from the counterfeit chip is employed as the reference power on burst noise (POBN) spectra in step 85 of the power on burst noise (POBN) depicted in FIG. 5. The power on burst noise (POBN) signature from the counterfeit chip may then be used to screen a large quantity of chips using the methodology that is described above with reference to FIG. 5.

In yet another embodiment, the power on burst noise (POBN) test may be used first on a large quantity of integrated circuits (ICs) to separate them in groups (buckets) based on the similarity in their signatures, i.e., power on burst noise (POBN) spectra. Then one or more representative integrated circuit (IC) of each group may undergo the method for characterizing integrated circuits (ICs) by measuring light emission, as described with reference to FIG. 15, to determine if the chips in that group are counterfeit or not.

The following examples are provided to further illustrate the present invention and demonstrate some advantages that arise therefrom. It is not intended that the invention be limited to the specific examples disclosed.

EXAMPLES

To demonstrate the utility of the power on bust noise (POBN) test in detecting aging of integrated circuit components, a mixed signal circuit was characterized using the power on burst noise (POBN) test apparatus depicted in FIG. 4. The device under test (DUT) 30 was a read only memory device (472 kbits) with 660 sense amplifiers and digital scan logic used for cell selection. In this circuit, the flush delay of one of the latch chains used for cell addressing was measured after applying different voltage stresses to the device under test (DUT) 30. The flush delay is basically the propagation delay of a state change from input of the latch chain to the output. The flush delay depends on the power supply voltage (Vdd) and the threshold voltage (Vt) of the transistors in the latch chain. As the integrated circuit ages, increases in the threshold voltage (Vt), caused by the NbTi shift or other degradation processes, increase the flush delay. The increase may be small and difficult to detect for small threshold voltage (Vt) shifts. In addition, there may be other degradation processes (such as time dependent dielectric breakdown) occurring within the circuit that can adversely affect the chip reliability and operation, in which those effects may not be detectable from a flush delay test.

Figure 16:
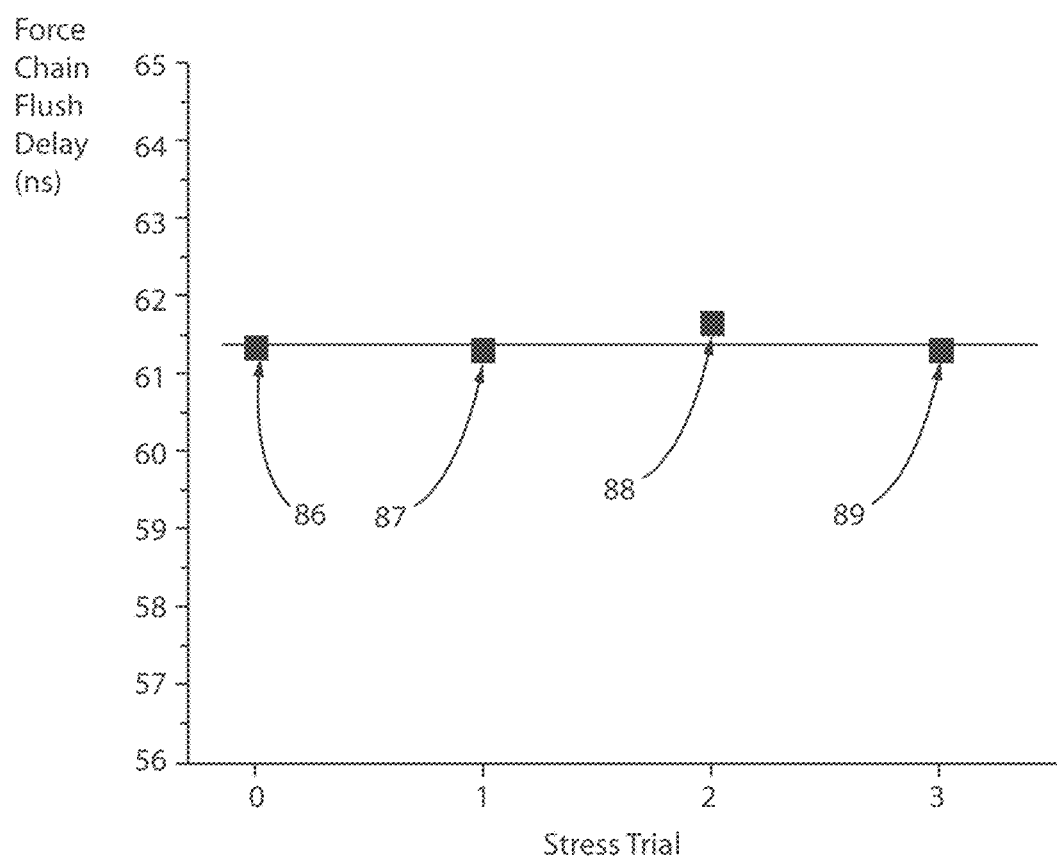
FIG. 16 is a plot of force chain flush delay taken from an integrated circuit tested using a standard digital test system, in accordance with one embodiment of the present disclosure.

The device under test (DUT) was characterized for flush delay and power on burst noise (POBN) spectra under different bias conditions. FIG. 16 is a plot of force chain flush delay taken from the integrated circuit tested using the power on burst noise (POBN) test system. An initial baseline with a power supply voltage (Vdd) equal to 1.0 V was acquired with a virgin part (an integrated circuit with 0 power on hours). The data point for the initial baseline is identified by reference number 86 in FIG. 16. Thereafter, the device under test (DUT) was run for different periods of time at increasingly higher supply voltages, in order to accelerate the effects of chip aging. The first stress applied was at a power supply voltage (Vdd) that was equal to 1.25 V for a time period of 10 min, and is identified by reference number 87 in FIG. 16. The second stress was at a power supply voltage (Vdd) that was equal to 1.5 V for a time period of 12 hours, and is identified by reference number 88 in FIG. 16. The third stress was at a power supply voltage (Vdd) that was equal to 1.6 V for an additional 14 hours, and is identified by reference number 89 in FIG. 16. As illustrated in FIG. 16, little change was detected in the flush delay of this latch chain.

Figure 17:
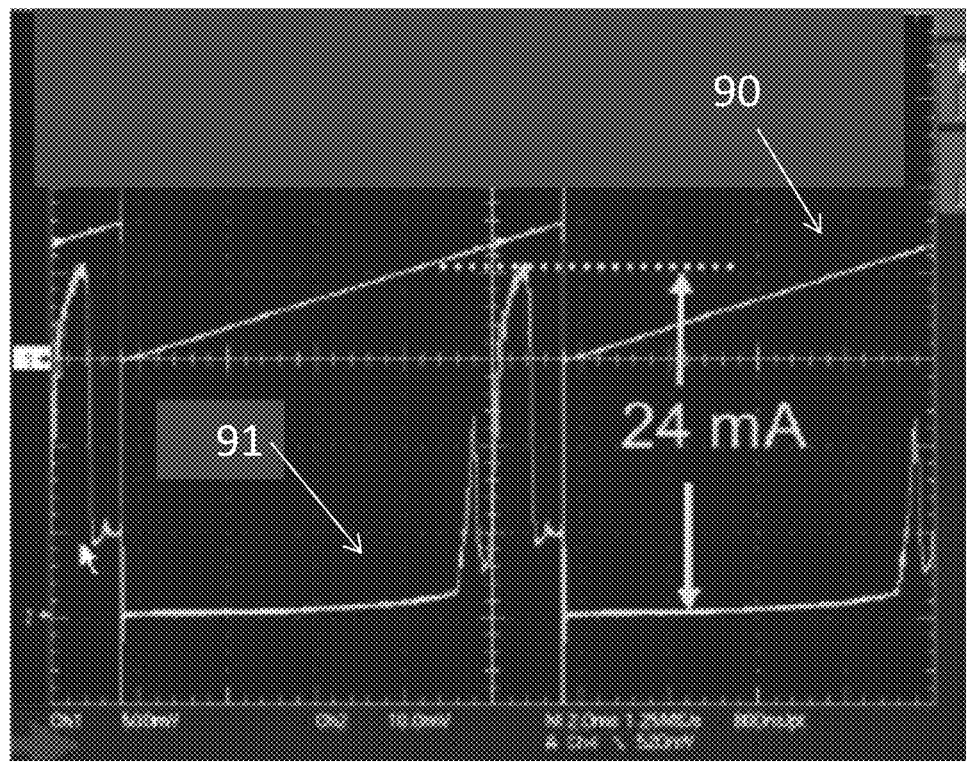
FIG. 17 depicts a power on burst noise (POBN) spectra obtained from an integrated circuit measured using the power on burst noise (POBN) test system after applying a power supply voltage (Vdd) of 1.5 V for a time period of 12 hours, in accordance with one embodiment of the present disclosure.
Figure 18:
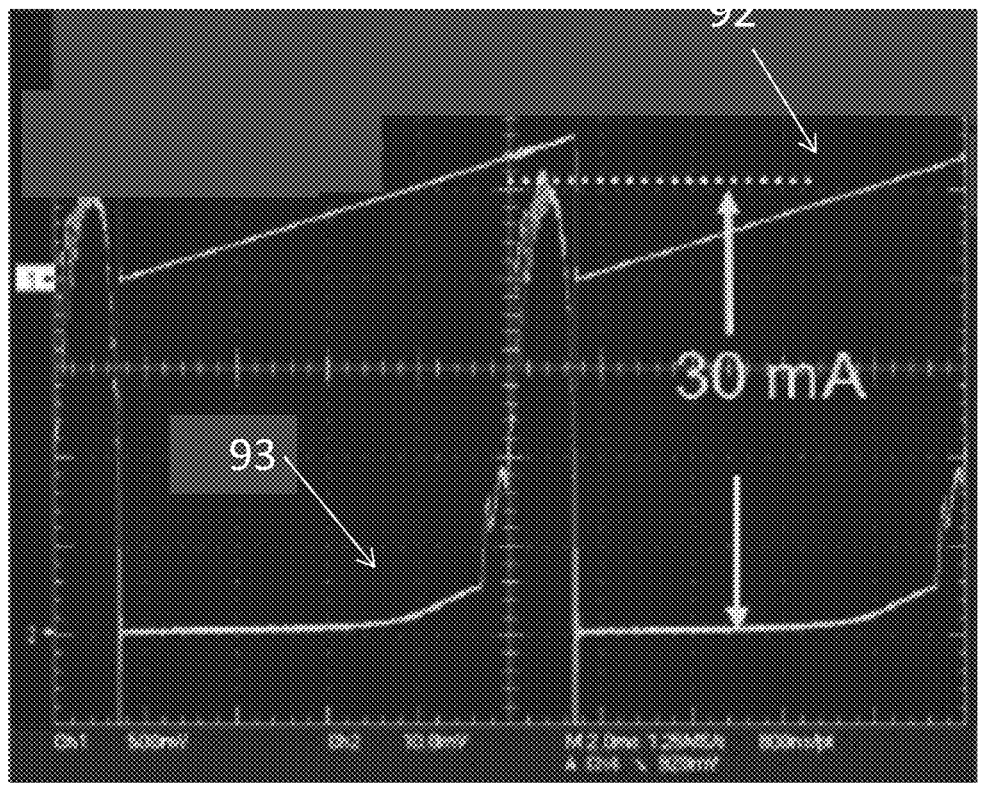
FIG. 18 depicts a power on burst noise (POBN) spectra obtained from an integrated circuit measured using a power on burst noise (POBN) test system after applying a power supply voltage (Vdd) equal to 1.6 V for 36 hours, in accordance with one embodiment of the present disclosure.

FIG. 7 depicts a power on burst noise (POBN) spectra obtained from the same device under test (DUT) used to provide the force chain flush delay depicted in FIG. 16, wherein the device under test (DUT) is in its virgin state. FIG. 17 depicts a power on burst noise (POBN) spectra obtained from the integrated circuit measured using the power on burst noise (POBN) test system depicted in FIG. 4 after applying a power supply voltage (Vdd) of 1.5 V for a time period of 12 hours. In FIG. 17, the plot identified by reference number 90 is the applied power supply voltage (Vdd), and the plot identified by reference number 91 is the measured power supply current (Idd). FIG. 18 depicts a power on burst noise (POBN) spectra obtained from the integrated circuit measured using the power on burst noise (POBN) test system depicted in FIG. 4 after applying a power supply voltage (Vdd) equal to 1.6 V for another 14 hours (a total of 36 hours). In FIG. 18, the plot identified by reference number 92 is the applied power supply voltage (Vdd), and the plot identified by reference number 93 is the measured power supply current (Idd).

In the power on burst noise spectrum depicted in FIGS. 7, 17 and 18, several peaks in the power supply current (Idd) are clearly resolvable, indicating several different circuit blocks using transistors with several different threshold voltages (Vt). As depicted in FIGS. 7, 17 and 18, the power on burst noise (POBN) spectrum is affected by the elevated voltage stress, even though no change was observed in the flush delay measurement depicted in FIG. 16. From this data, the condition of the field effect transistors (FETs) can be tracked, from initial fabrication through the life of the part.

Having described preferred embodiments for the method for characterization and monitoring of integrated circuits using supply current burst noise, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for characterizing an integrated circuit that comprises:
   ramping a power supply voltage to an integrated circuit as a function of time from below a threshold voltage for each transistor in the integrated circuit, by a testing device that is connected to the power supply pins of the integrated circuit;
   measuring a power supply current for the integrated circuit during said ramping of the power supply voltage as said function of said time as the integrated circuit is brought to an operating bias condition, the operating bias condition being when said each transistor has reached its nominal operating bias point, wherein measured peaks in the power supply current are a current pulse that identifies an operation state of the integrated circuit; and comparing the peaks in the power supply current to reference peaks for a power supply current for a reference circuit having a same functionality as the integrated circuit to determine integrated circuit fitness using a computer implemented method of the testing device.

2. The method of claim 1, wherein the measured peaks in the power supply current are acquired during a single ramping of the power supply voltage or is an average for the measured peaks obtained during multiple said ramping of the power supply voltage.

3. The method of claim 1, wherein the integrated circuit includes complementary metal oxide semiconductor (CMOS) arrangements.

4. The method of claim 3, wherein the CMOS arrangement includes at least one n-type field effect transistor and at least one p-type field effect transistor.

5. The method of claim 4, wherein each of said peaks in the power supply current corresponds to a threshold voltage of a family of said at least one NFET and said at least one PFET.

6. The method of claim 5, wherein an area of a curve corresponding to each of said peaks in the power supply current is correlated to a distribution of threshold voltage for said family of said at least one NFET and said at least one PFET.

7. The method of claim 6, wherein a larger area of said curve corresponds to a larger distribution of threshold voltage in comparison to a smaller area of said curve.

8. The method of claim 6, wherein said distribution of threshold voltage is correlated to power on hours for the integrated circuit, wherein as said power on hours for the integrated circuit increases, said distribution of threshold voltage increases.

9. The method of claim 6, wherein said comparing the peaks in the power supply current to said reference peaks to establish circuit fitness identifies a presence of counterfeit components in the integrated circuit, wherein the peaks in the power supply current do not match the reference peaks.

10. A method for characterizing an integrated circuit that comprises:
ramping a power supply voltage to an integrated circuit as a function of time from below a threshold voltage for each transistor in the integrated circuit, by a testing device that is connected to the power supply pins of the integrated circuit;
measuring a power supply current for the integrated circuit during said ramping of the power supply voltage as said function of said time as the integrated circuit is brought to an operating bias condition, the operating bias condition being when said each transistor has reached its nominal operating bias point, wherein measured peaks in the power supply current are a current pulse that identifies an operation state of the integrated circuit, wherein the measured peaks in the power supply current are acquired during a single ramping of the power supply voltage or is an average for the measured peaks obtained during multiple said ramping of the power supply voltage; and
comparing the peaks in the power supply current to reference peaks for a power supply current for a reference circuit having a same functionality as the integrated circuit using a computer implemented method of the testing device to determine integrated circuit fitness.

11. The method of claim 10, wherein the integrated circuit includes complementary metal oxide semiconductor (CMOS) arrangements.

12. The method of claim 11, wherein the CMOS arrangement includes at least one n-type field effect transistor and at least one p-type field effect transistor.

13. The method of claim 12, wherein each of said peaks in the power supply current corresponds to a threshold voltage of a family of said at least one NFET and said at least one PFET.

14. The method of claim 13, wherein an area of a curve corresponding to each of said peaks in the power supply current is correlated to a distribution of threshold voltage for said family of said at least one NFET and said at least one PFET.

15. The method of claim 14, wherein a larger area of said curve corresponds to a larger distribution of threshold voltage in comparison to a smaller area of said curve.

16. The method of claim 15, wherein said distribution of threshold voltage is correlated to power on hours for the integrated circuit, wherein as said power on hours for the integrated circuit increases, said distribution of threshold voltage increases.

17. A non-transitory computer readable storage medium comprising a computer readable program for performing an integrated circuit characterization method, wherein the non-transitory computer readable program when executed on a computer causes the computer to perform the steps of:
ramping the power supply voltage to the integrated circuit as a function of time for each transistor in the integrated circuit, by a testing device that is connected to the power supply pins of the integrated circuit;
measuring the power supply current for the integrated circuit during the ramping of the power supply voltage as the integrated circuit is brought to an operating bias condition, the operating bias condition being when said each transistor has reached its nominal operating bias point, wherein measured peaks in the power supply current are a current pulse that identifies an operation state of the integrated circuit; and
comparing the peaks in the power supply current to reference peaks for a reference circuit having a same functionality as the integrated circuit to determine integrated circuit fitness using a computer implemented method of the testing device.

18. The non-transitory computer readable storage medium of claim 17, wherein the integrated circuit includes complementary metal oxide semiconductor (CMOS) arrangements, wherein the CMOS arrangement includes at least one n-type field effect transistor and at least one p-type field effect transistor.

19. The non-transitory computer readable storage medium of claim 17, wherein each of said peaks in the power supply current corresponds to a threshold voltage of a family of said at least one NFET and said at least one PFET, wherein an area of a curve corresponding to each of said peaks in the power supply current is correlated to a distribution of threshold voltage for said family of said at least one nFET and said at least one pFET.

20. The non-transitory computer readable storage medium of claim 17, wherein said comparing the peaks in the power supply current to said reference peaks to establish circuit fitness identifies a presence of counterfeit components in the integrated circuit, wherein the peaks in the power supply current do not match the reference peaks.

\* \* \* \* \*